United States Patent [19]
Tahara et al.

[11] Patent Number: 6,002,155
[45] Date of Patent: Dec. 14, 1999

[54] SEMICONDUCTOR INTEGRATED CIRCUIT WITH PROTECTION CIRCUIT AGAINST ELECTROSTATIC BREAKDOWN AND LAYOUT DESIGN METHOD THEREFOR

[75] Inventors: Akinori Tahara; Isao Amano, both of Kawasaki, Japan

[73] Assignee: Fujitsu Limited, Kawasaki, Japan

[21] Appl. No.: 08/874,980

[22] Filed: Jun. 13, 1997

Related U.S. Application Data

[62] Division of application No. 08/575,030, Dec. 19, 1995, Pat. No. 5,672,895, which is a division of application No. 08/194,988, Feb. 14, 1994, Pat. No. 5,500,542.

[30] Foreign Application Priority Data

| Feb. 12, 1993 | [JP] | Japan | 5-023119 |
| Mar. 18, 1993 | [JP] | Japan | 5-058469 |
| Sep. 2, 1993 | [JP] | Japan | 5-218863 |

[51] Int. Cl.$^6$ .................................................. H01L 23/62
[52] U.S. Cl. ......................... 257/355; 257/207; 257/357; 257/362
[58] Field of Search ................................... 257/357, 362, 257/207, 355

[56] References Cited

U.S. PATENT DOCUMENTS

| 4,819,046 | 4/1989 | Misu . | |
| 4,922,316 | 5/1990 | Sato | 257/355 |
| 5,248,892 | 9/1993 | Van Roozendaal et al. | 257/357 |

FOREIGN PATENT DOCUMENTS

| 53-126875 | 11/1978 | Japan . |
| 54-80090 | 6/1979 | Japan . |
| 58-30160 | 2/1983 | Japan . |
| 59-11670 | 1/1984 | Japan . |
| 60-158644 | 8/1985 | Japan . |
| 3-203363 | 9/1991 | Japan . |
| 3-291934 | 12/1991 | Japan . |
| 4-34963 | 2/1992 | Japan . |
| 4-206768 | 7/1992 | Japan . |
| 4-260366 | 9/1992 | Japan . |

*Primary Examiner*—Ngân V. Ngô
*Attorney, Agent, or Firm*—Staas & Halsey

[57] ABSTRACT

Diodes rows are arranged at interval L in the same direction as that of arrangement of cell rows. Each of the diodes rows has a row of pn junctions each formed on a substrate and arranged along a track vertical to interconnection tracks. The interconnection between cells automatically connect the gates of MOS transistors to the diodes without the need for considering which gate should be connected to the diode. The length of wiring between the gate of MOS transistor and a diode is less than an upper limit value for preventing electrostatic breakdown at a gate oxide in a process of fabricating the semiconductor integrated circuit. Each of the pn junctions may be formed under necessary input signal lines, necessary ground line, the bottom of the drain of MOS transistor or under the power supply line outside of macro-cell.

8 Claims, 24 Drawing Sheets

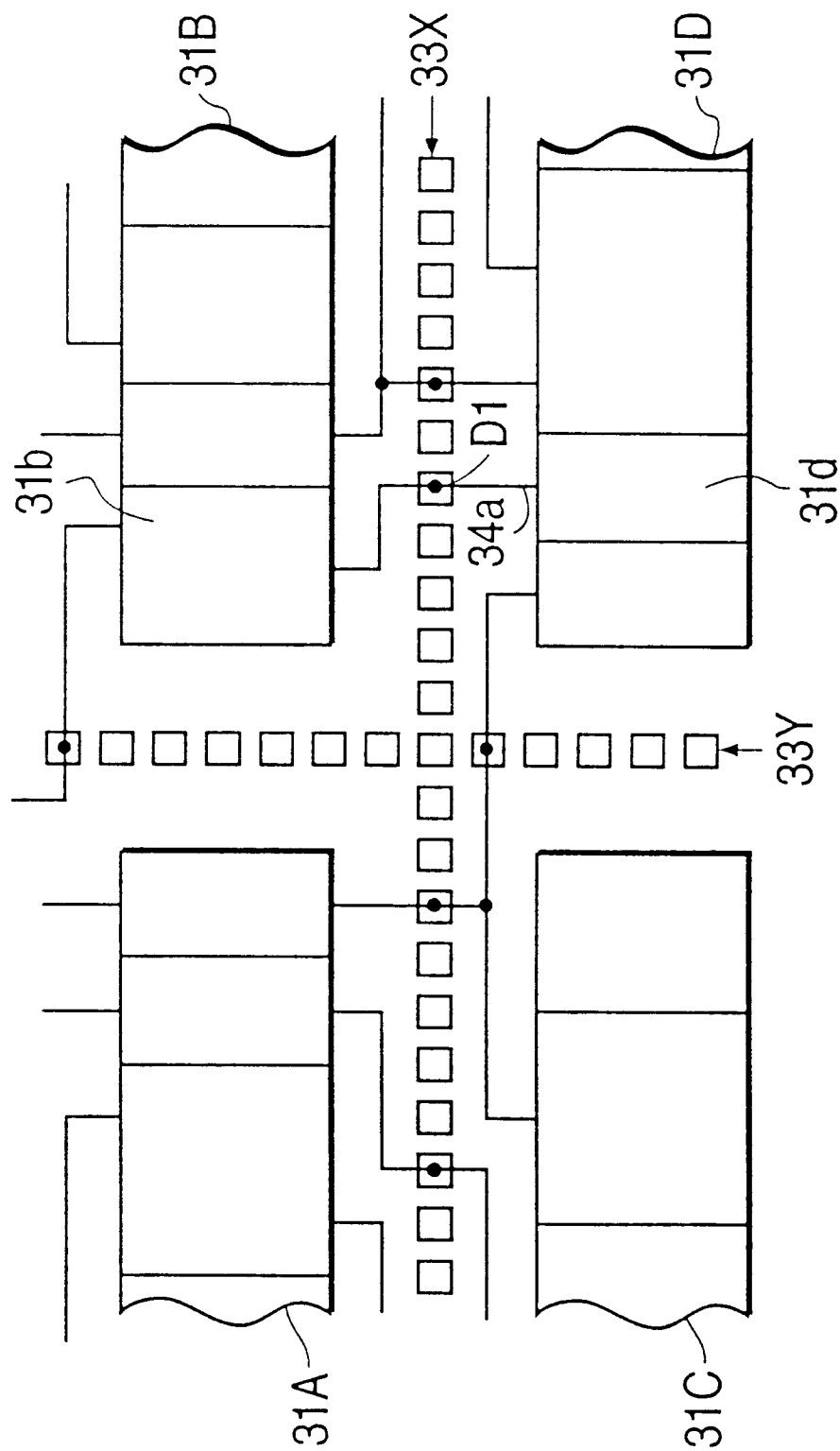

— : WIRE TRACK
— : WIRE
□ : DIODE ELECTRODE

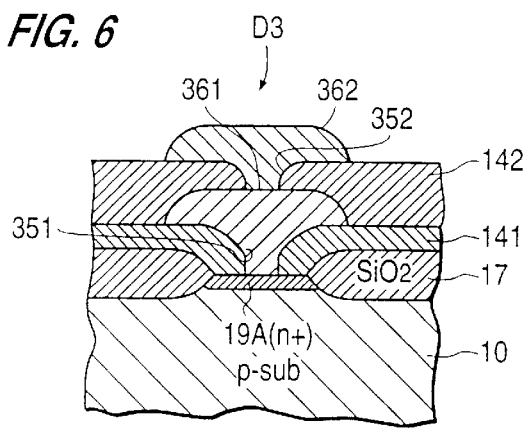
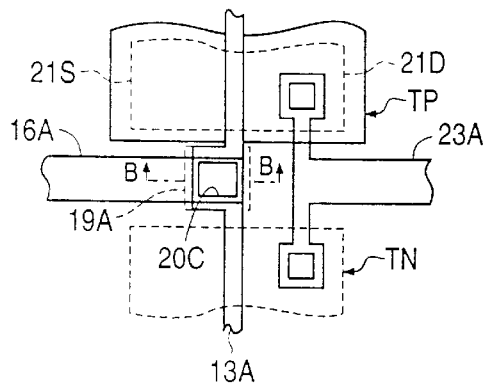
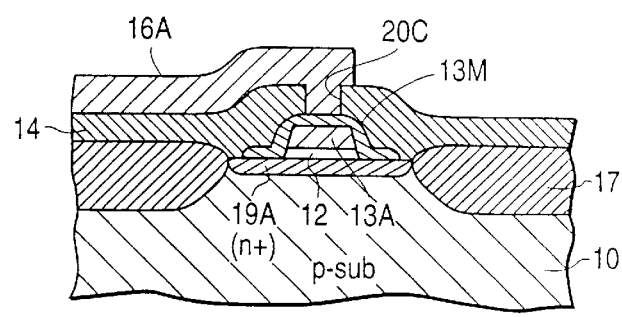

SEMICONDUCTOR INTEGRATED CIRCUIT WITH PROTECTION CIRCUIT AGAINST ELECTROSTATIC BREAKDOWN AND LAYOUT DESIGN METHOD THEREFOR

This application is a division of application Ser. No. 08/575,030, filed Dec. 19, 1995, now U.S. Pat. No. 5,672,895, which is a division of application Ser. No. 08/194,988, filed Feb. 14, 1994, now U.S. Pat. No. 5,500,766.

BACKGROUND OF THE INVENTION

1. Field of the Invention

The present invention relates to a semiconductor integrated circuit provided with a protection circuit against electrostatic breakdown of a gate oxide which is caused by plasma etching or the like in the process of fabricating the semiconductor integrated circuit, and to a layout design method therefor.

2. Description of the Prior Art

FIG. 27 is a sectional view of a part of a pMOS transistor. In FIG. 27, reference character 10 denotes a p-type substrate; 11, an n-type well; 12, gate oxide; 13, gate polysilicon; 14, a insulator; 15, a contact hole; 16, interconnection metal; 17, field oxide; and 18, a photoresist.

In the process of fabricating a semiconductor integrated circuit, when the interconnection metal pattern 16 is formed by plasma etching or plasma ashing, charge passes through the interconnection metal 16 and accumulates in the gate polysilicon 13 due to the charge in the plasma. The smaller the components of semiconductor integrated circuit, the thinner the gate oxide 12, and thereby the lower its insulation strength. If the voltage between the gate polysilicon 13 and an n-type well 11 exceeds the insulation breakdown voltage due to the accumulation of charge, a discharge occurs between the gate polysilicon 13 and the n-type well 11 with damaging the gate oxide 12, thereby changing the characteristics of the transistor, such as the threshold voltage and the drain current thereof. This prevents the normal circuit operation. This phenomenon becomes more serious as the interconnection length is increased by multilayer wiring.

In order to solve this problem, a diode with a reverse breakdown voltage which is lower than the insulation breakdown voltage of the gate oxide 12 and higher than the supply voltage is connected between the gate and the substrate, as shown in FIGS. 28A, 28B and 29. FIG. 28B is a sectional view taken along line B—B in FIG. 28A, and FIG. 29 is a circuit diagram of the structure shown in FIGS. 28A and 28B.

In FIGS. 28A and 28B, reference character 19 denotes an $n^+$-type region; 20, a contact hole; 21S and 21D each, a $p^+$-type region; 22S and 22D each, an $n^+$-type region; 23, interconnection metal; 24, power supply metal line for supplying a potential higher than the ground; and 25, ground metal line as another power supply line. A pMOS transistor TP comprises the $p^+$-type regions 21S and 21D, the gate polysilicon 13 and the gate oxide 12. A nMOS transistor TN comprises the $n^+$-type regions 22S and 22D, the gate polysilicon 13 and the gate oxide 12. The diode D comprises the p-type substrate 10 and the $n^+$-type region 19 with forming a pn junction.

The above-described structure causes the accumulated charge to pass through the diode D and flow into the substrate before the gate oxide is electrostatically broken down if charge is accumulated in the gate polysilicon 13 in the process of fabricating IC. The diode D may be connected, as shown by a dotted line in FIG. 29.

However, when the diode D is arranged for each gate, as shown in FIG. 28A, excess region is required for the diodes D, and the chip size is thus increased. In particular, in ASIC of a gate array, a standard cell system or the like, since basic cell circuits are arranged in a matrix, an increase in the size of the basic cell circuits including the diodes D significantly affects an increase in the chip size. In addition, when the diode D is arranged for each gate, the number of the diodes D becomes excessively large, and the operating speed of the circuit is thus decreased due to the parasitic capacitance of each diode.

On the other hand, when the diodes D are connected to only the gates to which long wiring causing the problem of electrostatic breakdown is connected, since excess region must be secured for the diodes, the design becomes complicated.

SUMMARY OF THE INVENTION

Accordingly, an object of the present invention is to provide a semiconductor integrated circuit with a protection circuit against electrostatic breakdown, which can prevent an increase in the chip size, and which can easily be designed.

Another object of the present invention is to provide a layout design method for an integrated circuit with a protection circuit for protecting against electrostatic breakdown.

According to the first aspect of the present invention, there is provided a semiconductor integrated circuit with protecting against electrostatic breakdown, wherein cells having MIS transistors are arranged on a substrate, a specific circuit being achieved by interconnections between the cells, comprising diode rows arranged at a interval, each of the diode rows including: a pn junction row having pn junctions along a track vertical to interconnection tracks, the pn junctions being on the interconnection tracks, each of the pn junctions being formed between a first conduction type region formed on the substrate and a second conduction type, which is opposite type to the first conduction type, formed around the first conduction type region in the substrate; and electrodes each being in a contact hole formed from the surface of the first conduction type region to a metal wiring layer for the interconnections so as to automatically connect the electrode to the interconnection metal by wiring the interconnections along the interconnection tracks.

By the above-described first aspect of the present invention, it is possible to decrease the length of interconnection between the gate of the MIS transistor and the diode to an allowable value, without considering which wiring is connected to the diode, thereby automatically satisfying the conditions for electrostatic protection and thus facilitating the layout design. In addition, since there is no need for arranging a diode for each of the cells, it is possible to prevent an increase in the chip size.

In one form of the above-described first aspect of the present invention, the pn junction rows are provided in one direction of arrangement of the cells and another direction vertical to the one direction, and the electrodes comprises: first electrodes each being in a contact hole formed from the surface of the first conduction type region in the another direction to a second metal wiring layer from the substrate.

According to the second aspect of the present invention, there is provided a semiconductor integrated circuit with protecting against electrostatic breakdown, wherein CMIS circuit having a pMIS transistor and an nMIS transistor provided adjacent to each other are arranged on a substrate and a gate line of the pMIS transistor and the nMIS transistor is common, comprising: a pn junction formed between a first conduction type region formed on the substrate and a second conduction type, which is opposite type to the first conduction type, formed around the first conduction type region in the substrate, the pn junction being arranged within a clearance region between the pMIS transistor and the nMIS transistor; and an input signal line a part of which is arranged within the clearance region in a metal wiring layer and connected to both the gate line and the first conduction type region through a contact hole formed from the metal wiring layer to the surface of the first conduction type region.

By the above-described second aspect of the present invention, it is possible to avoid an increase in the chip area since the pn junction is formed under the necessary input signal lines. Even if a circuit without the pn junction is replaced by the circuit with the pn junction formed therein, the design becomes rather simple because the sizes of both circuits can be made the same.

According to the third aspect of the present invention, there is provided a semiconductor integrated circuit with protecting against electrostatic breakdown, wherein CMIS circuits each having a pMIS transistor and a nMIS transistor provided adjacent to each other are arranged on a substrate and a gate line of the pMIS transistor and the nMIS transistor is common, comprising: a pn junction formed between a first conduction type region formed on the substrate and a second conduction type, which is opposite type to the first conduction type, formed around the first conduction type region in the substrate, the pn junction being located within a clearance region between the pMIS transistor and the nMIS transistor; and a metal film having a thickness smaller than that of the gate line and coated across on the surface of the gate lines and the coated across on the surface of the gate lines and the surface of the first conduction type region; and an input signal line a part of which is arranged within the clearance region in a metal wiring layer and connected to the metal film through a contact hole formed from the metal wiring layer to the surface of the metal film on the gate line.

By the above-described third aspect of the present invention, it is possible to connect more surely between the input signal lines and the gate than the second aspect of the present invention.

According to the fourth aspect of the present invention, there is provided a semiconductor integrated circuit with protecting against electrostatic breakdown, wherein MIS transistors are provided on a substrate, and power supply lines are arranged near the MIS transistors, comprising; a pn junction formed between a first conduction type region formed on the substrate and a second conduction type, which is opposite type to the first conduction type, formed around the first conduction type region in the substrate, the pn junction being located under the power supply line and by the MIS transistor; wherein a gate line of the MIS transistor is extended to a region between the power supply line and the pn junction, one end of the gate being connected to the surface of the first conduction type region through a contact hole.

By the above-described fourth aspect of the present invention, it is possible to get the same effect as that of the second aspect of the invention since the pn junction is formed under the necessary power supply line.

In the first form of the above-described fourth aspect of the present invention, the opposite conduction type region is formed on the substrate so as to be biased by connecting to the power supply line, and contains impurities at a concentration higher than that of the periphery thereof.

By the above-described first form of the fourth aspect of the present invention, it is possible to utilize effectively the one conduction type region for the use of biasing for forming a diode.

In the second form of the above-described fourth aspect of the present invention, a part of the extended portion of the gate line has a higher resistivity than that of the other part of the gate line.

By the above-described second form of the fourth aspect of the present invention, it is possible to prevent a decrease in the operating speed since the influences of the capacity of the pn junction is decreased by the part of higher resistivity.

In the third form of the above-described fourth aspect of the present invention, the part of the extended portion of the gate is narrower than the other part of the gate line so as to have high resistivity.

By the above-described third form of the fourth aspect of the present invention, it is possible to prevent the operating speed of the MIS transistor from being decreased by the capacity of the pn junction since the narrow portion can be cut by passing a current therethrough, for example, in the test stage, after the semiconductor integrated circuit is fabricated.

In the fourth form of the above-described fourth aspect of the present invention, the part of the extended portion of the gate is curved in the direction perpendicular to the substrate, and the curved portion is thinner than that of the other portion of the gate so as to have high resistivity.

According to the fifth aspect of the present invention, there is provided a semiconductor integrated circuit with protecting against electrostatic breakdown, wherein MIS transistors are provided on a substrate, comprising; a pn junction formed between a n-type region which is a drain of a n-channel MIS transistor and a p+-type region formed at the bottom of the drain; whereby the surface of the drain is connected to a gate of another MIS transistor.

By the above-described fifth aspect of the present invention, it is possible to get the same effect as that of the second aspect of the invention since the pn junction is formed under the necessary electrode. In addition, the structure becomes more simple since there is no need for providing a special interconnection between the pn junction and the electrode. Moreover the drain region can be effectively used for forming the diode.

According to the sixth aspect of the present invention, there is provided a layout design method for a semiconductor integrated circuit having MIS transistors, comprising the steps of: designing a layout of the whole or a part of the semiconductor integrated circuit by arranging only first cells without patterns of a pn junction diode for protection against electrostatic breakdown and connecting between the first cells with interconnection patterns; judging for each of all gate patterns arranged as to whether or not a ratio of area of whole wiring connected to gate pattern to area of the gate pattern is higher than a reference value; and replacing the first cell, which includes the gate, with second cell having the first cell, patterns of a pn junction diode and an electrode connected to the gate when it is judged that the ratio is higher than the reference value. The above judging step may be omitted.

According to the seventh aspect of the present invention, there is provided a layout design method for a semiconductor integrated circuit having MIS transistors, comprising the steps of: designing a layout of the whole or a part of the semiconductor integrated circuit by arranging only first cells without patterns of a pn junction diode for protection against electrostatic breakdown and connecting between the first cells with interconnection patterns; judging for each of all gate patterns arranged as to whether or not a ratio of area of whole wiring connected to gate pattern to area of the gate pattern is higher than a reference value; additionally arranging a second cell between the first cells when it is judged that the ratio is higher than the reference value, the second cell having the same power supply line pattern as that of the first cells and pn junction diode pattern with a electrode pattern; and connecting between the electrode pattern of the diode pattern and a wiring pattern in a first metal wiring layer from a substrate, the wiring pattern being one of wiring patterns connected to the gate pattern for which it is judge that the ratio is higher than the reference value. The above judging step may be omitted.

According to the eighth aspect of the present invention, there is provided a layout design method for a semiconductor integrated circuit having MIS transistors, comprising the steps of: designing a layout of the whole or a part of the semiconductor integrated circuit by arranging only first cells without the pattern of a pn junction diode for protection against electrostatic breakdown and connecting between the first cells with interconnection patterns; judging for each of all gate patterns arranged as to whether or not a ratio of area of whole wiring connected to gate pattern to area of the gate pattern is higher than a reference value; and additionally arranging a diode pattern at an end of a wiring pattern in first metal wiring layer from a substrate, the wiring pattern being connected to the gate pattern for which it is judged that the ratio is higher than the reference, an electrode pattern of the diode pattern being connected to the wiring pattern. The above judging step may be omitted.

By anyone of the above-described sixth to eighth aspect of the present invention, it is possible to prevent a decrease in the operating speed of the circuit because the number of diodes is not excessively large. In addition, it is possible to facilitate the layout design since a cell may simply be replaced and there is no need for securing excess region for protection against electrostatic breakdown.

According to the ninth aspect of the present invention, there is provided a layout design method for a semiconductor integrated circuit having MIS transistors, comprising the steps of: making a layout of a macrocell having the cells and the interconnection patterns between the cells by the method described above; judging for each of all input signal line patterns of the macrocells as to whether or not the input signal line pattern is connected to the electrode pattern of the diode pattern; and additionally arranging a diode pattern such that the input signal line pattern is connected to an electrode pattern of the diode pattern when it is judge that the input signal line pattern is not connected to the electrode pattern. The above judging step may be omitted.

By the above-described ninth aspect of the present invention, it is possible to facilitate the layout design since there is no need for inspecting protection for electrostatic breakdown in regard to the wiring between macrocells. In addition, it is possible to prevent an increase in the size of a macrocell, i.e., the chip size even if additional diode patterns are arranged.

According to the tenth aspect of the present invention, there is provided a layout design method for a semiconductor integrated circuit having MIS transistors, comprising the steps of: making a layout of a macrocell having cells and interconnection patterns between the cells; arranging power supply line patterns which are in a first metal wiring layer form a substrate and are outside of the macrocell; arranging a diode pattern under each of all the power supply line patterns such that the power supply line patterns each is connected to an electrode pattern of the diode pattern.

By the above-described tenth aspect of the present invention, it is possible to facilitate the layout design since there is no need for inspecting protection for electrostatic breakdown in regard to the power supply line arranged outside the macrocells. In addition, it is possible to prevent an increase in the chip size since the pn junction is formed under the power supply line.

In one form of the above-described tenth aspect of the present invention, further comprising the steps of: arranging power supply line patterns which are in a second metal wiring layer from the substrate and are outside of the macrocell; arranging a diode pattern under each of all the power supply line patterns in the second metal wiring layer such that each of the power supply line patterns in the second metal wiring layer is connected to an electrode pattern of the diode pattern.

BRIEF DESCRIPTION OF THE DRAWINGS

FIG. 2 is a view illustrating the wiring between cells in the gate array shown in FIG. 1;

FIG. 6 is a sectional view of the electrostatic protection diode shown in FIG. 5;

FIG. 8A is fragmentary view illustrating the pattern of a part of a CMOS inverter provided with a protection circuit against electrostatic breakdown in accordance with a fourth embodiment of the present invention, and FIG. 8B is a sectional view taken along line B—B in FIG. 8A;

DESCRIPTION OF THE PREFERRED EMBODIMENTS

Figure 1:
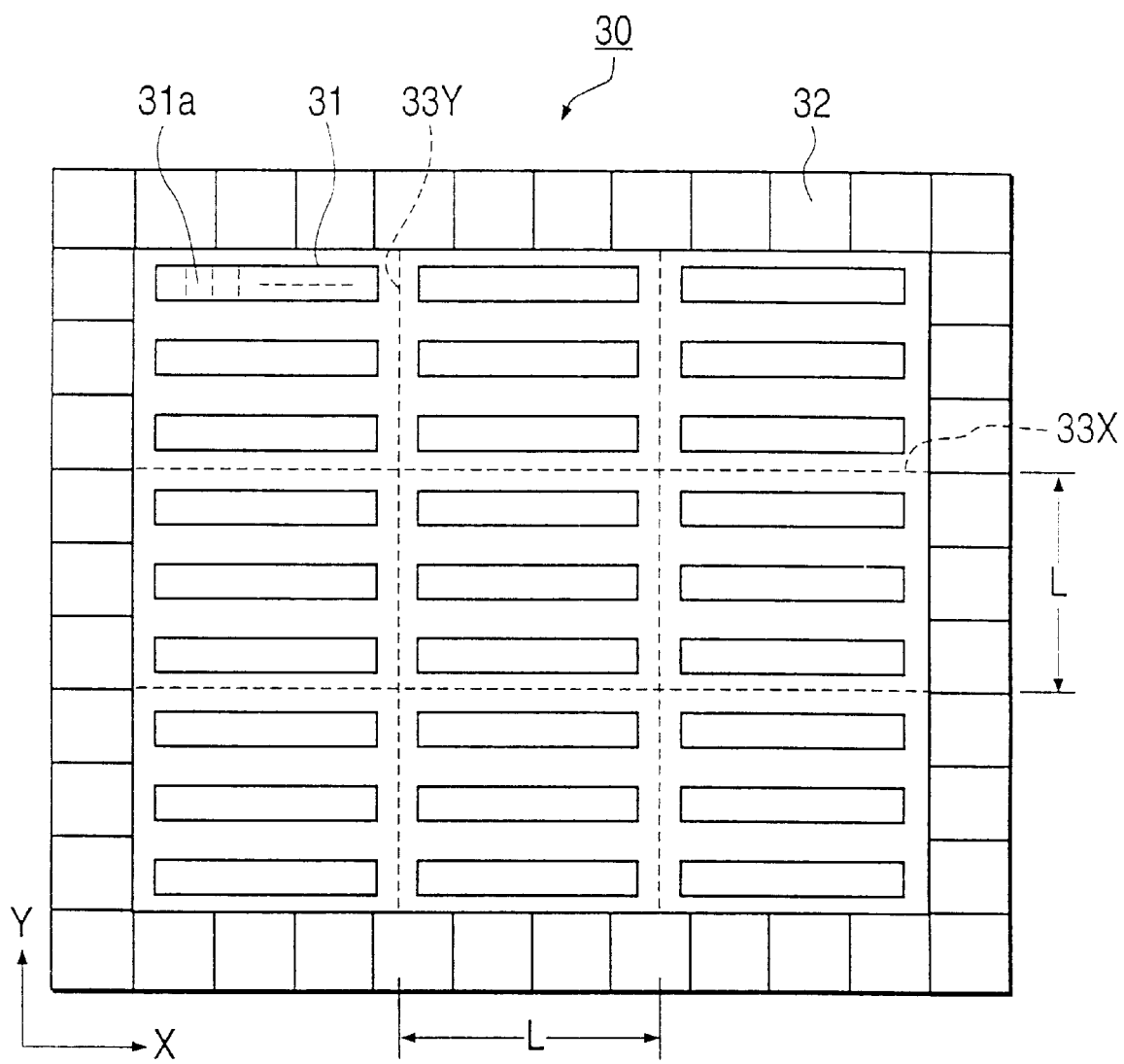
FIG. 1 is a schematic view illustrating the pattern of a gate array provided with a protection circuit against electrostatic breakdown in accordance with a first embodiment of the present invention.

Referring now to the drawings, wherein like reference characters designate like or corresponding parts throughout several views, embodiments of the present invention are described below.
First Embodiment FIG. 1 shows a gate array 30 provided with a protection circuit against electrostatic breakdown in accordance with a first embodiment.

In the gate array 30, cell rows 31 each having cells 31a which are arranged in the direction X shown in FIG. 1 are arranged in the directions X and Y shown in FIG. 1, and I/O cells 32 are arranged in the peripheral portion. Wiring regions are provided between the adjacent cell rows 31. In the wiring regions, diode rows 33X each having diodes D which are arranged at a constant pitch in the direction X are arranged at a constant interval L, and diodes rows 33Y each having diodes D which are arranged at a constant pitch in the direction Y are arranged at the constant interval L. The interval L is smaller, by a margin, than a lower limit of the length of wiring connected to a gate, which possibly causes electrostatic breakdown of the gate oxide, as described above.

Figure 29:
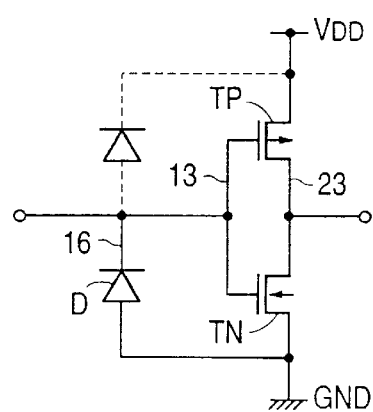
FIG. 29 is a view illustrating the circuit of the CMOS inverter shown in FIG. 28.

FIG. 2 shows wiring between the cells in the gate array shown in FIG. 1 by the central lines of a wiring pattern. In FIG. 2, reference characters 31A to 31D each denote a cell row. For example, if the cells 31b and the cells 31d are connected by wiring 34a, the wiring 34a is passed through a diode D1 in the diode row 33K, and is thus connected to the substrate through the diode D1, as shown by a solid line in FIG. 29.

Figure 3A:
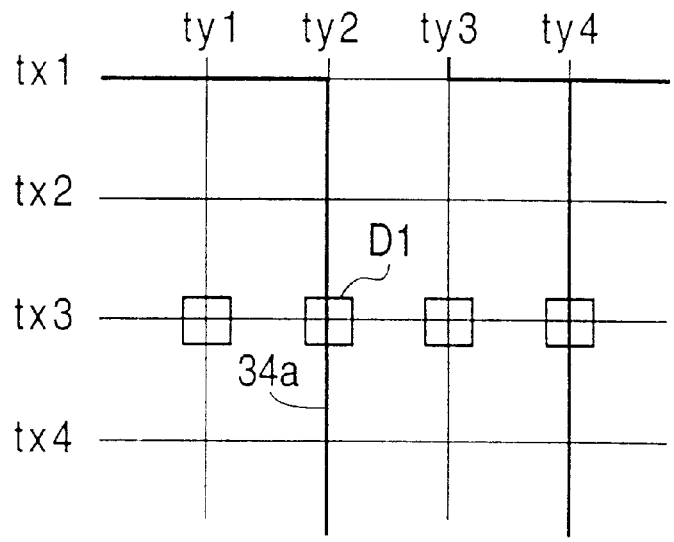
FIGS. 3A and 3B is a view illustrating a method of wiring in a portion near a diode row.
Figure 3B:
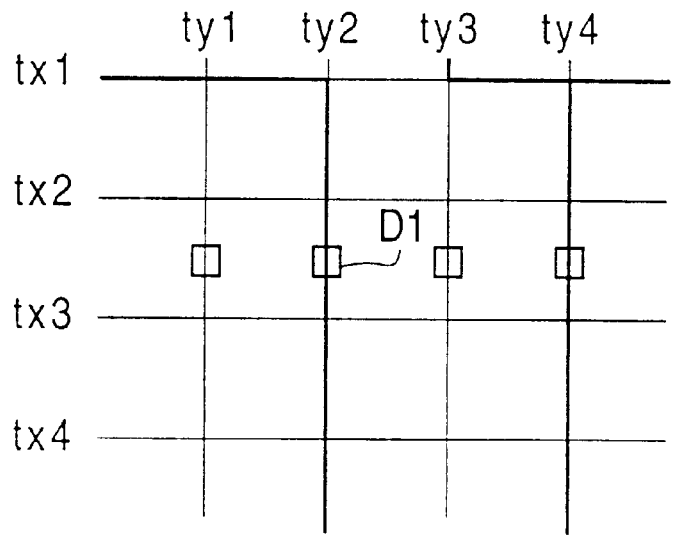

In order to obtain such wiring, for example, the diodes may respectively be arranged at the intersections of a track tx3 and tracks ty1 to ty4 of a lattice track for wiring, as shown in FIG. 3A, and wiring design may be made automatically or manually in accordance with the wiring rule that wiring can be laid only on the track. Alternatively, the diodes may be arranged on the tracks ty1 to ty4 between the tracks tx2 and tx3, as shown in FIG. 3B. In this case, wiring along the track tx2 and the track tx3 is prohibited for the sake of securing the distance between the wiring and unconnected diodes. However, if the electrode size of each diode is decreased, as shown in the drawings, this prohibition need not be provided.

Figure 4A:
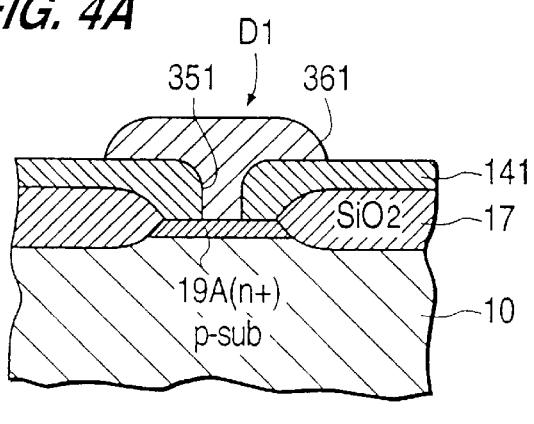
FIG. 4A is a sectional view of the electrostatic protection diode shown in FIG. 2.
Figure 4B:
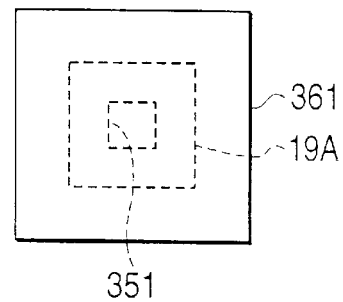
FIG. 4B is a view showing a pattern corresponding to FIG. 4A.

FIG. 4A is a sectional view of the structure of the diode D1, and FIG. 4B is a view showing the pattern of the diode D1 shown in FIG. 4A.

The diode D1 comprises a p-type substrate 10, an $n^+$-type region 19A formed on the p-type substrate 10, a field oxide 17 deposited on the p-type substrate 10, an insulator 141 deposited on the p-type substrate 10 and the $n^+$-type region 19A, and a rectangular electrode 361 contacted through a hole 351 formed in the insulator 141 in correspondence with the central portion of the $n^+$-type region 19A to the $n^+$-type region 19A. The reverse avalanche breakdown voltage of the diode D1 is lower than the insulation breakdown voltage of the gate oxide 12 and higher than the power supply voltage for the semiconductor integrated circuit. The electrode 361 is formed at the same time as the interconnection shown in FIG. 2. Namely, exposure is performed by using a mask in which an interconnection pattern and electrode patterns of the diode rows 33X and 33Y are formed.

The first embodiment described above permits the length of wiring between the gate of, for example, the cell 31b or 31d shown in FIG. 2, and the diode D1 to be decreased to L or less without considering which wiring should be connected to the diode, thereby automatically satisfying the conditions for protection against the electrostatic breakdown.

In addition, there is no need for arranging a diode for each of the cells, thereby preventing increase of the chip size.

In FIG. 2, it is sufficient to form the pn junction to which a reverse voltage is applied thereto when the semiconductor integrated circuit is operated. Therefore, if the substrate 10 is the n-type, the diffusion layer 19A is made of p-type. An n-type well may be formed on the p-type substrate 10, and a p-type diffusion layer may be formed on the n-type well.

This can be applied to the embodiments below.

The first embodiment described above can be applied to the ASIC which is sea of gates, standard cell system or the like.

Second Embodiment

Figure 5:
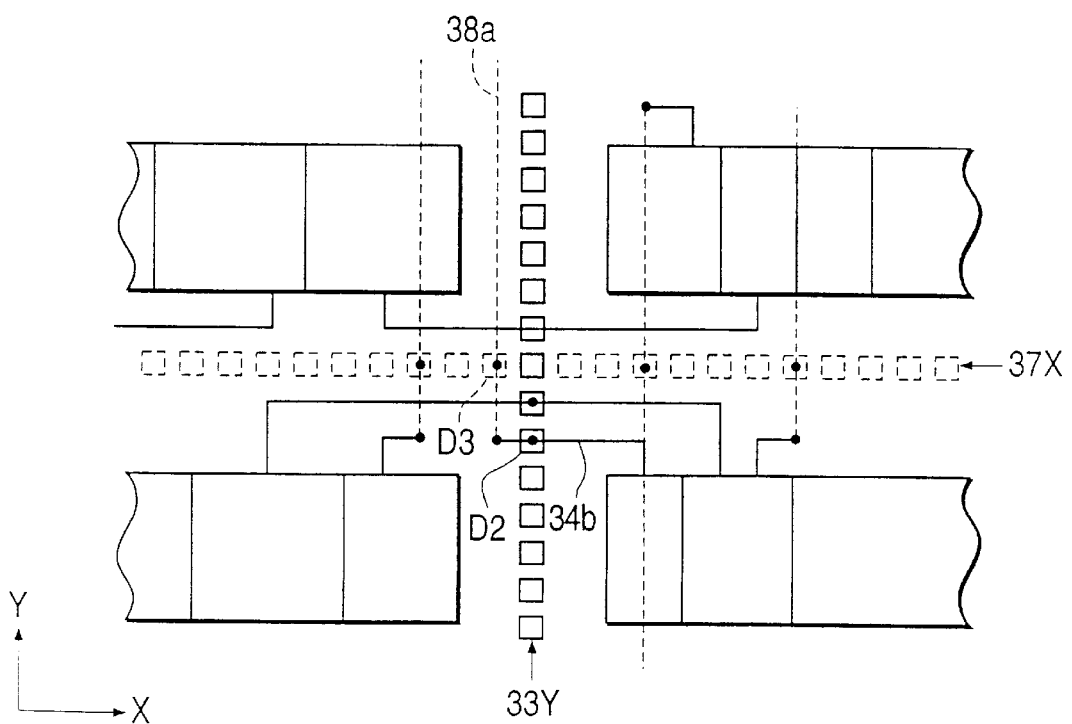
FIG. 5 is a view illustrating interconnection between cells in a gate array provided with a protection circuit against electrostatic breakdown in accordance with a second embodiment of the present invention.

FIG. 5 shows interconnection between cells in a gate array provide wit a protection circuit against electrostatic breakdown in accordance with a second embodiment.

This interconnection comprises metal wirings in the first metal wiring layer shown by solid lines and the second wiring layer above the first metal wiring layer shown by dotted lines. The wiring in the first metal wiring layer is limited to the direction x shown in the FIG. 5, and the wiring in the second wiring layer is limited to the direction Y shown in FIG. 5 in accordance with the wiring rule for avoiding intersection of wiring. However, if the length of the wiring drawn out of a cell is within a set range, the direction of the wiring is not limited as exception.

The diode rows 33Y are formed in the first metal wiring layer in the same manner as shown in FIG. 1, and the diode rows 37X are formed at the same positions as those of the diode rows 33X shown in FIG. 2 in the second wiring layer. For example, the wiring 34 in the first metal wiring layer is connected through the contact hole to the wiring 38 in the second wiring layer, the wiring 34b passing through the diode D2, and the wiring 38a passing through the diode D3.

The diode D2 has the same structure as that of the diode D1 shown in FIG. 4A, and the diode D3 has the structure shown in FIG. 6. Namely, the diode D3 comprises the same structure as shown in FIG. 4A and further comprises an insulator 142 deposited on the insulator 141 and the electrode 361, and a rectangular electrode 362 contacted through a hole 352 formed in the insulator 142 in correspondence with the central portion of the electrode 361 to the electrode 361. The electrode 361 is formed at the same time as the formation of the wiring in the first metal wiring layer, and the electrode 362 is formed at the same time as the formation of the wiring in the second wiring layer.

The concept of the second embodiment described above can be applied to a case having more than two wiring layers. Since the structure of this case can easily be analogized, it is not described below.

Third Embodiment

Figure 7A:
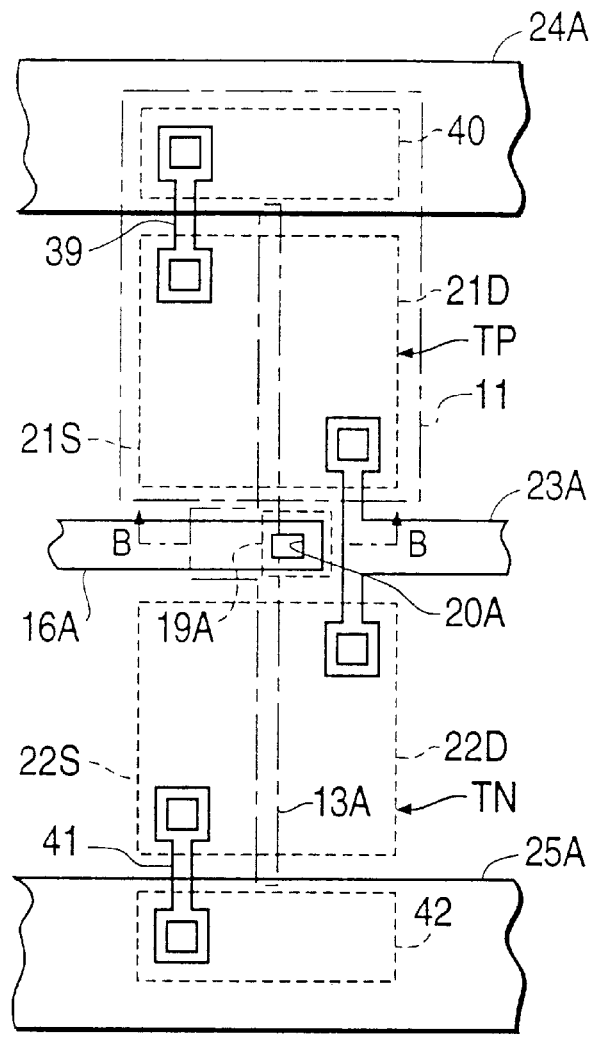
FIG. 7A is a view illustrating the pattern of a CMOS inverter provided with a protection circuit against electrostatic breakdown in accordance with a third embodiment of the present invention.
Figure 7B:
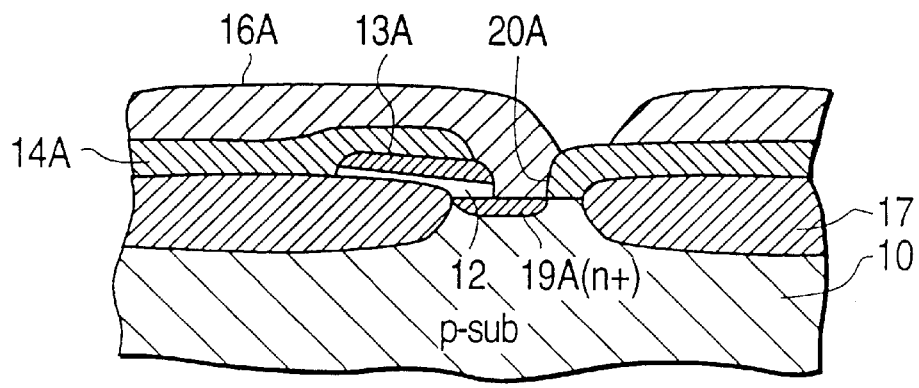
FIG. 7B is a sectional view taken along line B—B in FIG. 7A.

FIGS. 7A and 7B shows a CMOS inverter as an example of a CMOS circuit provided with a protection circuit against electrostatic breakdown in accordance with a third embodiment. FIG. 7A is a view showing the pattern of the CMOS inverter, and FIG. 7B is a sectional view taken along line B—B in FIG. 7A.

In this CMOS inverter, power supply line 24B is disposed outside and above the $p^+$-type regions 21S and 21D which are formed on the n-type well 11, ground line 25A is disposed outside and above the $n^+$-type regions 22S and 22D which are formed on the substrate, and signal input line metal 16A and signal output line metal 23A are disposed between the $p^+$-type regions 21S and 21D and the $n^+$-type regions 22S and 22D, thereby increasing the wiring region above the $p^+$-type regions 21S and 21D and the $n^+$-type regions 22S and 22D.

The $p^+$-type region 21S is connected to one end of the interconnection metal 39, the other end of that being connected to both the power supply line 24A which is above the metal 39 and a $n^+$-type region 40 on the substrate 10 which is under the metal 39. Similarly, the $n^+$-type region 22S is connected to one end of interconnection metal 41, the other end of that being connected to both the ground line 25A which is above the metal 41 and the $p^+$-type region 42 on the substrate 10 which is under the metal 41. The $n^+$-type region 40 is for supplying reverse bias between the source 21S and the substrate 10. The $p^+$-type region 42 is for supplying reverse bias between the source 22S and the substrate 10. The n+-type regions 40 and 19A are formed by the same process as that for the n+-type regions 22S and 22D.

A contact hole 20A is formed in the insulator 14A in correspondence with the central portion of the $n^+$-type region 19A so that one end of the interconnection metal 16A is contacted to both the $n^+$-type region 19A and the gate polysilicon 13A through the contact hole 20A. In the contact hole 20A, one end of the gate polysilicon 13A is projected from the insulator 14A due to a difference between the etching speeds of the gate polysilicon 13A and the insulator 14A. This ensures connection between the interconnection metal 16A and the gate polysilicon 13A.

The charge produced in the gate polysilicon 13A or the interconnection metal 16A in the production process is passed through the pn junction between the p-type substrate 10 and the $n^+$-type region 19A and is discharge to the p-type substrate 10.

In this third embodiment, since the pn junction is formed under the necessary interconnection metal 16A, it is possible to avoid an increase in the chip size even if the pn junction is formed for all CMOS inverters.

In addition, even if a circuit without the pn junction is replaced by a circuit with the pn junction formed therein, design is simple because the sizes of both circuits can be made the same.

Fourth Embodiment

FIGS. 8A and 8B show a part of a CMOS inverter provided with a protection circuit against electrostatic breakdown in accordance with a fourth embodiment of the present invention. FIG. 8A is a fragmentary view showing the pattern, and FIG. 8B is a sectional view taken along line B—B in FIG. 8A This fourth embodiment is the same as the third embodiment with the exception that the interconnection metal 16A and the gate polysilicon 13A are locally interconnected. Namely, a metal film 13M is deposited on the gate polysilicon 13A and the $n^+$-type region 19A so as to conduct between the metal film 13M and the gate polysilicon 13A, and between the metal film 13M and the $n^+$-type region 19A. The metal film 13M has a thickness smaller than that of the gate polysilicon 13A, and preferably has a melting point higher than that of the interconnection metal 16A made of aluminum or the like. The metal film 13M is made of, for example, tungsten or titanium, and exhibits high patterning precision even if it is thin. The thickness of the metal film 13M is, for example, 0.1 $\mu$m, which is about ⅛ of that of the interconnection metal 16A. After the metal film 13M is deposited, the insulator 14 is deposited, and the contact hole 20C is formed in the insulator 14 at a position above the central portion of the metal film 13M. One end of the interconnection metal 16A formed on the insulator 14 is contacted to the metal film 13M through the contact hole 20C.

Since local interconnection is used in a fine memory cell, when a semiconductor integrated circuit provided with the CMOS inverter comprises such a memory cell, local interconnection can be formed by the same process as that for local interconnection in the memory, and a special process is not required.

The fourth embodiment is the same as the third embodiment in the other points.

As obvious from FIG. 8B, the fourth embodiment enables more accurate connection between the interconnection metal 16A and the gate polysilicon 13A than that in the third embodiment.

Fifth Embodiment

Figure 9A:
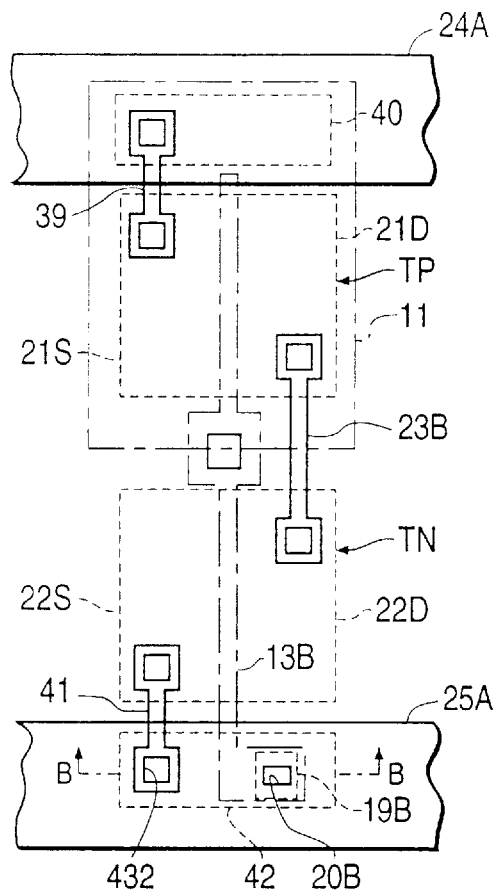
FIG. 9A is a view illustrating the pattern of a CMOS inverter provided with a protection circuit against electrostatic breakdown in accordance with a fifth embodiment of the present invention.
Figure 9B:
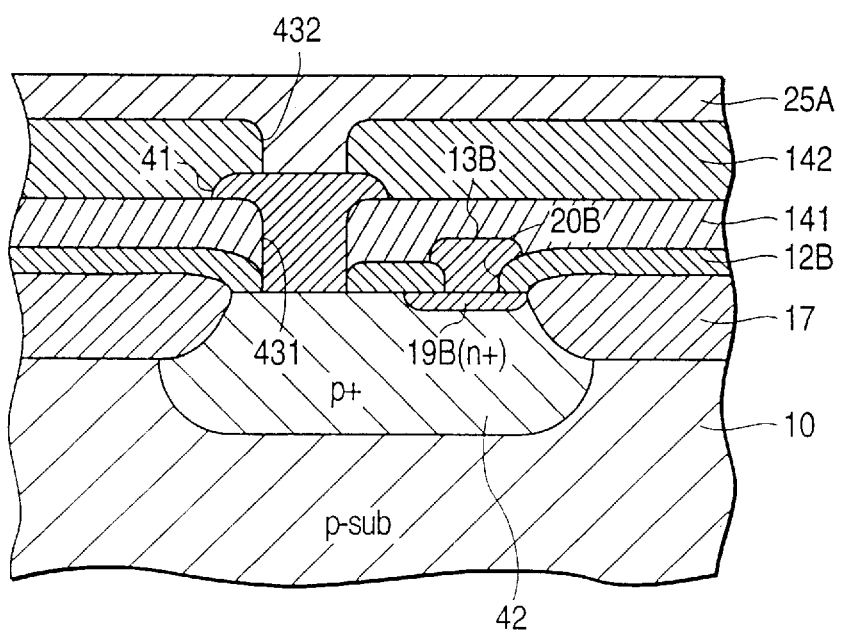
FIG. 9B is a sectional view taken along line B—B in FIG. 9A.

FIGS. 9A and 9B shows a CMOS inverter provided with a protection circuit against electrostatic breakdown in accordance with a fifth embodiment. FIG. 9A is a view showing the pattern of the inverter, and FIG. 9B is a sectional view taken along line B—B in FIG. 9A.

In this CMOS inverter, one end of gate polysilicon 13B is extended to a position under the central portion of the ground line 25A, and an $n^+$-type region 19B is formed in the $p^+$-type region 42, the gate polysilicon 13B being connected to the $n^+$-type region 19B through the contact hole 20B formed in the gate oxide 12B. The connection between the interconnection metal 41 and the $p^+$-type region 42 and the ground line 25A is the same as in the embodiment shown in FIG. 7A. The interconnection metal 41 is connected to the $p^+$-type region 42 through the contact hole 431 formed in the insulator 141 and the gate oxide 12B, and is connected to the ground line 25A through the contact hole 432 formed in the insulator 142.

In the fifth embodiment, since the pn junction is formed under the necessary ground line 25A, as in the third embodiment, it is possible to avoid increase of the chip area even if the pn junction is formed for all CMOS inverters.

Even if a circuit without the pn junction is replaced by a circuit with the pn junction formed therein, the design is simple because the sizes of both circuits can be made the same.

Further, the $p^+$-type region 42 for reverse bias between the source 22S and the substrate 10 can effectively used for forming a diode.

Sixth Embodiment

Figure 10A:
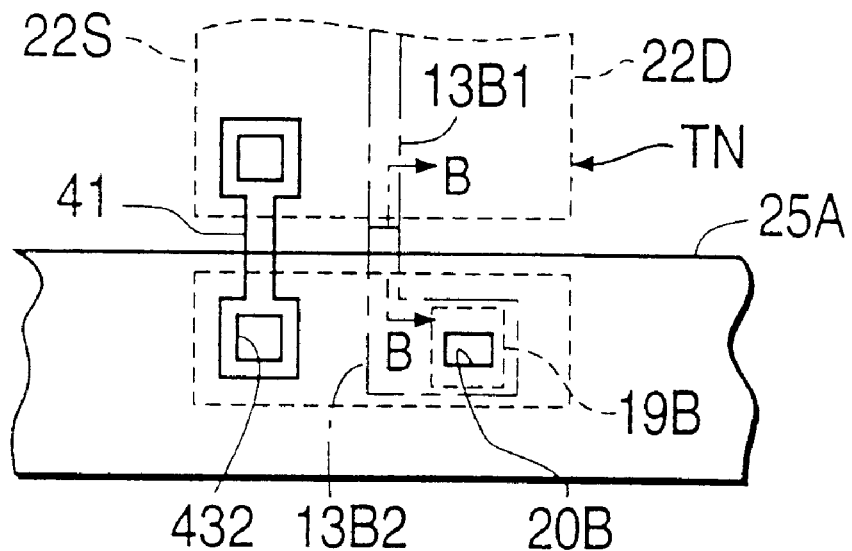
FIG. 10A is a fragmentary view illustrating the pattern of a portion of a CMOS inverter provided with a protection circuit against electrostatic breakdown in accordance with a sixth embodiment of the present invention.
Figure 10B:
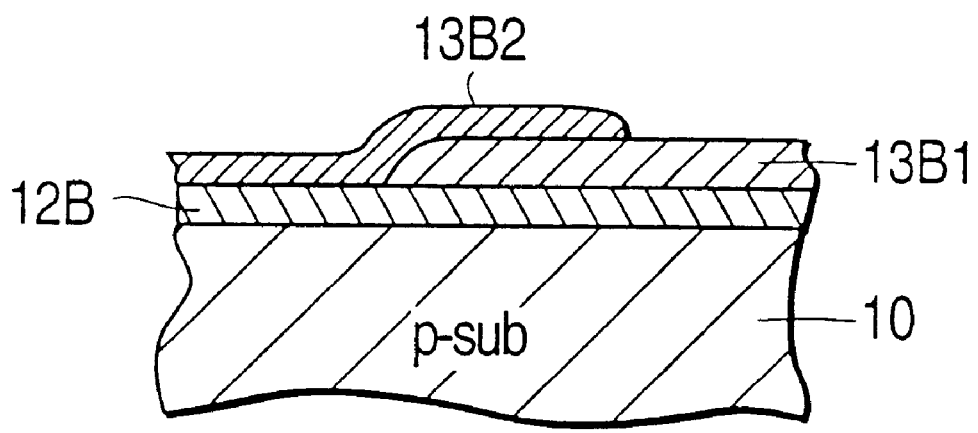
FIG. 10B is a sectional view taken along line B—B in FIG. 10A.

FIG. 10A shows a CMOS inverter provided with a protection circuit against electrostatic breakdown in accordance with a sixth embodiment. FIG. 10A is a fragmentary view showing the pattern, and FIG. 10B is a sectional view taken along line B—B is FIG. 10A.

In this CMOS inverter, a gate polysilicon 13B1 and a metal film 13B2 is substituted for the gate polysilicon 13B shown in FIG. 9. The metal film 13B2 is deposited on the gate oxide 12B, as the same as gate polysilicon 13B1, an end of the metal film 13B2 on an end of the gate polysilicon 13B1 being connected thereto.

The sixth embodiment is the same as the fifth embodiment in the other points.

Seventh Embodiment

Figure 11A:
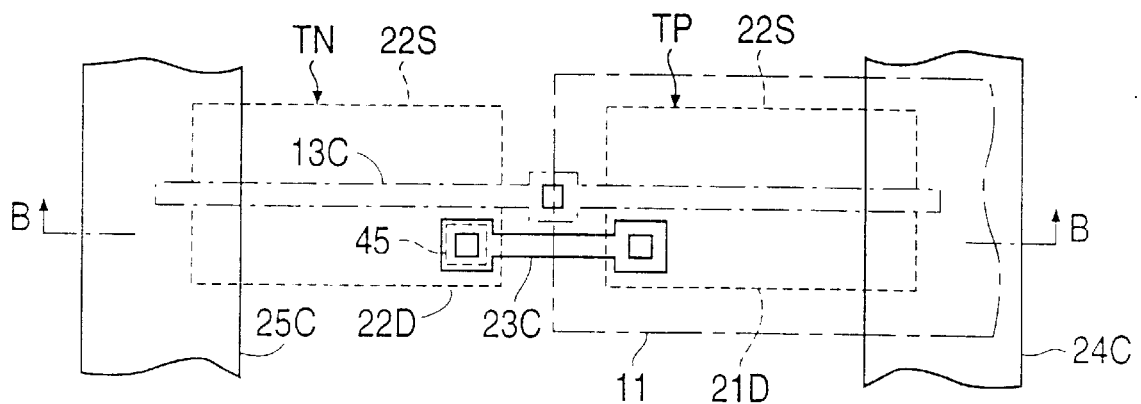
FIG. 11A is a view illustrating the pattern of a CMOS inverter provided with a protection circuit against electrostatic breakdown in accordance with a seventh embodiment of the present invention.
Figure 11B:
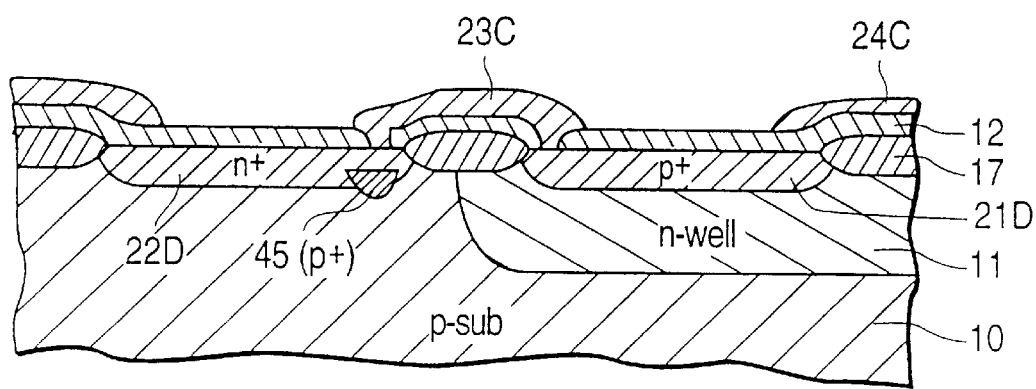
FIG. 11B is a sectional view taken along line B—B in FIG. 11A.

FIGS. 11A and 11B shows a CMOS inverter provided with a protection circuit against electrostatic breakdown in accordance with a seventh embodiment. FIG. 11A is a view showing the pattern of the inverter, and FIG. 11B is a sectional view taken along line B—B in FIG. 11A.

In this CMOS inverter, a $p^+$-type region 45 is formed under the contact between one end of the interconnection metal 23C and the drain made of $n^+$-type region 22D at the boundary between the $n^+$-type region 22D and the p-type substrate 10 to form the pn junction between the $p^+$-type region 45 and the $n^+$-type region 22D. Although the interconnection metal 23C is signal output wiring of the CMOS inverter, since the interconnection metal 23C is connected to the signal input terminal of another CMOS inverter (not shown), the gate of the CMOS inverter is consequently connected to the pn junction through the interconnection metal 23C.

In the seventh embodiment, the pn junction is formed under the necessary interconnection metal 23C, as in the third embodiment, it is thus possible to avoid an increase of the chip area even if the pn junction is formed for all CMOS inverters.

In addition, there is no need for selecting a CMOS inverter for which the pn junction should be formed, thereby simplifying the design of an integrated circuit.

Since there is also no need for providing a specific connection for connecting the pn junction and the interconnection metal 23C, the structure is more simple, and the design is also simple.

Further, the drain 22D can effectively used for forming a diode.

Eighth Embodiment

Figure 12:
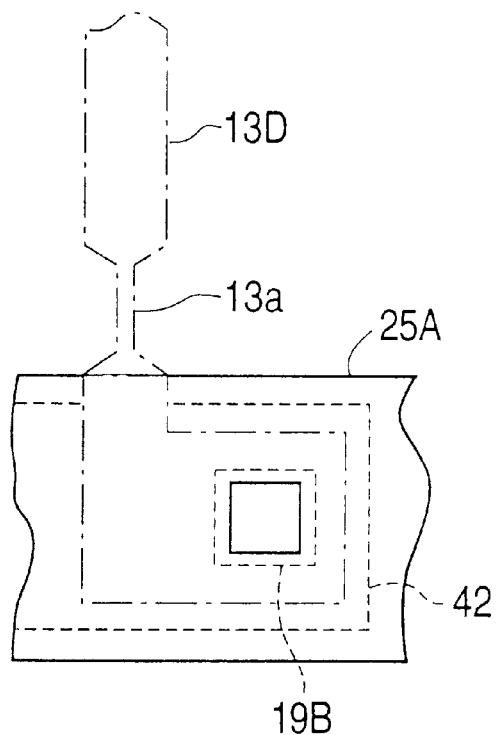
FIG. 12 is a fragmentary view illustrating the pattern of a protection circuit against electrostatic breakdown in accordance with an eighth embodiment of the present invention.

FIG. 12 shows a protection circuit against electrostatic breakdown in accordance with an eighth embodiment.

In this circuit, gate polysilicon 13D has a narrow portion 13a which is near the $n^+$-type region 19B and which is applied to, for example, the CMOS inverter shown in FIG. 9A.

When the gate polysilicon 13D is charged in the production process, the narrow portion 13a is not easily cut due to the heat generated by electric current since the duration of the current flowing into the substrate through the narrow portion 13a and the pn junction is relatively short. Even if the narrow portion 13a is cut, most of the charge has already flowed into the substrate. In any cases, the pn junction is useful for protection against electrostatic breakdown.

The narrow portion 13a is cut by passing a current therethrough, for example, in test stage, after a semiconductor integrated circuit is produced, thereby separating the gate polysilicon 13D from the pn junction and preventing the operating speed of the CMOS inverter from being decreased due to the capacity of the pn junction.

Even if the narrow portion is not cut, the effect of the capacity of the pn junction is less than that in the above embodiments because the resistance of the narrow portion 13a is relatively large.

Ninth Embodiment

Figure 13:
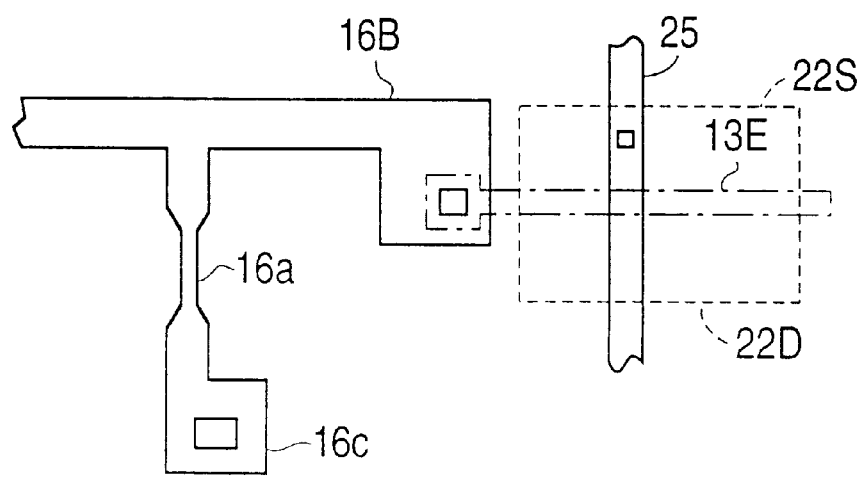
FIG. 13 is a fragmentary view illustrating the pattern of a protection circuit against electrostatic breakdown in accordance with a ninth embodiment of the present invention.

FIG. 13 shows protection circuit against electrostatic breakdown in accordance with a ninth embodiment.

In this circuit, an end of gate polysilicon 13E of a MOS transistor is connected to interconnection metal 16B which has a branch in a free region, and a narrow portion 16a is formed in an intermediate portion of the branch, interconnection metal 16C extended from the narrow portion 16a being connected to the substrate through a contact hole.

By cutting the narrow portion 16a surely with passing a current therethrough in the test stage, as in the eighth embodiment, the interconnection metal 16B is separated from the interconnection metal 16C, and thus the pn junction need not be formed in the connection portion between the interconnection metal 16C and the substrate.

Tenth Embodiment

Figure 14:
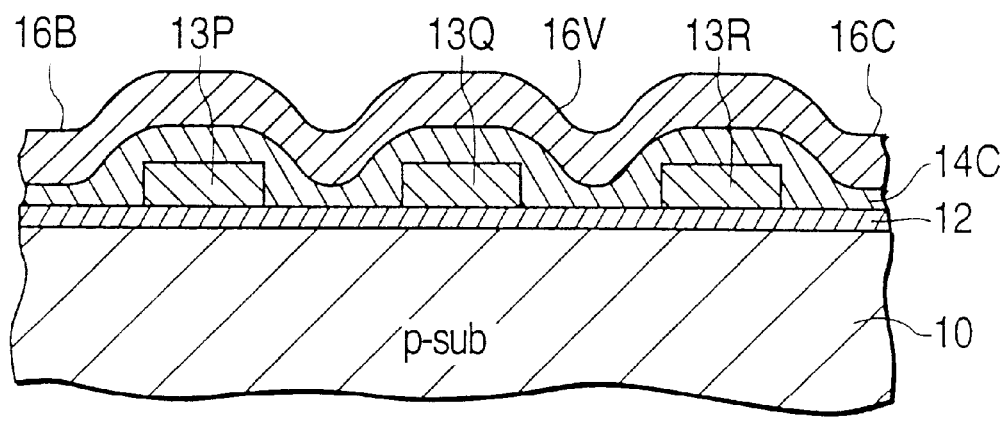
FIG. 14 is a fragmentary sectional view illustrating a part of a protection circuit against electrostatic breakdown in accordance with a tenth embodiment of the present invention.

FIG. 14 shows a part of a protection circuit against electrostatic breakdown in accordance with a tenth embodiment.

In this circuit, in place of formation of the narrow portion 16a shown in FIG. 13, polysilicon 13P, 13Q and 13R are formed on the substrate through the gate oxide 12, the intervals of these polysilicon 13P, 13Q and 13R are substantially the same as the wiring width, the interconnection metal 16V is formed on the insulator 14C, thereby the interconnection metal 16V is vertically curved and the thickness of wiring is decreased in the curved portions.

This increases the resistance value of the curved portion 16V, as compared with the values of the portion 16B and 16C which are at both sides of the interconnection metal 16V. The curved portion 16V can thus be cut by passing a current therethrough in the test stage, as in the eighth embodiment.

Eleventh Embodiment

Figure 15:
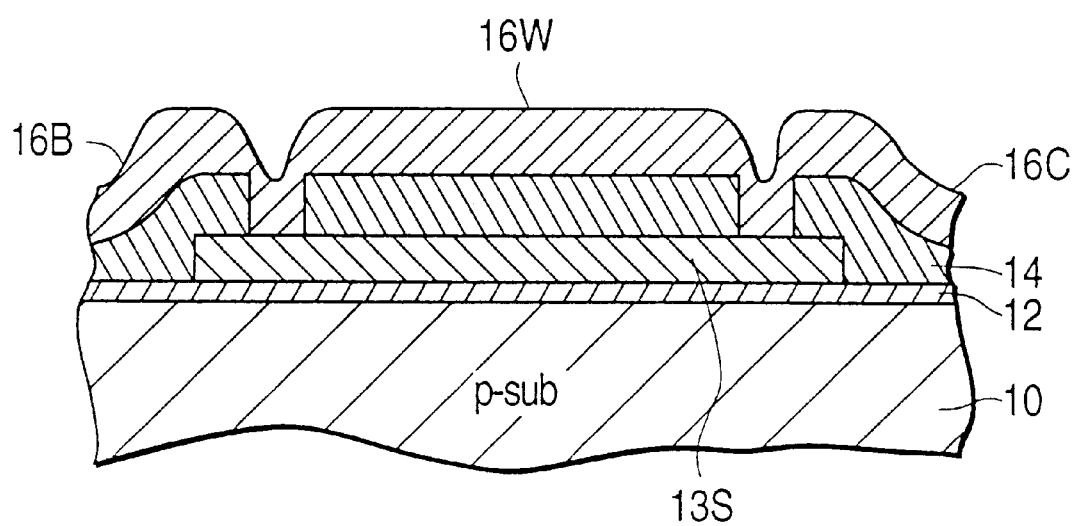
FIG. 15 is a fragmentary sectional view illustrating a part of a protection circuit against electrostatic breakdown in accordance with a eleventh embodiment of the present invention.

FIG. 15 shows a part of a protection circuit against electrostatic breakdown in accordance with an eleventh embodiment.

This circuit can be used in place of the circuit shown in FIG. 14. Holes are formed in the insulator 14 on the polysilicon 13S near the ends of the polysilicon 13S and interconnection metal 16W is disposed across the polysilicon 13S on the insulator 14. The thickness of interconnection metal 16W in the curved portion between 16W and 16B and between 16W and 16C are decreased.

This embodiment has the same effects as those of the tenth embodiments.

A layout design method for a semiconductor integrated circuit with protection circuits against electrostatic breakdown is described below.

Twelfth Embodiment

When only cells each having the diode connected to a gate polysilicon as described above are used, protection against electrostatic breakdown by plasma etching or the like can automatically achieved. However, the number of the diodes is excessively large, and the operating speed of a circuit is thus decreased due to the capacity possessed by the diodes. When the layout of a semiconductor integrated circuit in which the high operating speed is required is designed, it is necessary to use as much cells without diodes as possible. Therefore, in this twelfth embodiment, the layout design is performed by the below-described method.

Figure 16A:
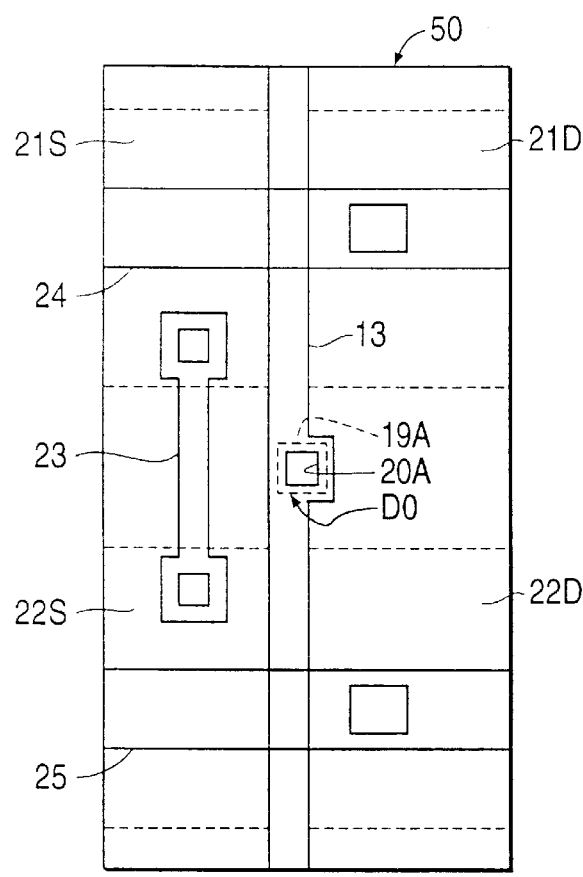
FIGS. 16A, 16B and 16C are views respectively illustrating the patterns of the special cells used in a layout design in accordance with a twelfth embodiment of the present invention.
Figure 16B:
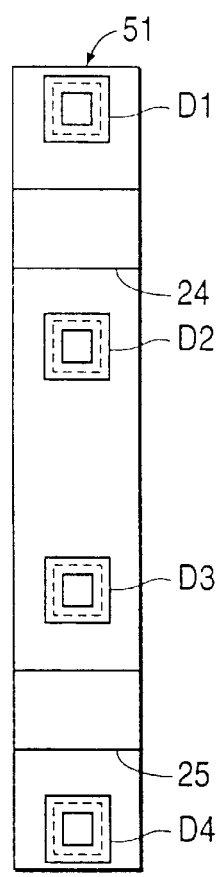
Figure 16C:
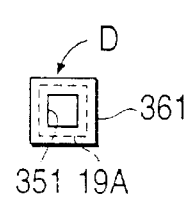

FIGS. 16A to 16C show a cell 50 having a protection circuit against electrostatic breakdown, a diode cell 51 and a diode D, respectively, as special cells. These special cells are first made in the preparation stage of layout design, and are registered in a library together with ordinary cells.

The protected cell 50 comprises a CMOS inverter having a pattern similar to that of the fourth embodiment, in which the gate polysilicon 13 is connected to the substrate through the diode D0. A cell having the same or similar pattern as that of one of the third, fifth and seventh embodiments may be registered in place of the protected cell 50. The diode D has the same structure as that shown in FIGS. 4A and 4B. The diode cell 51 comprises the power supply line 24, the ground line 25, diodes D1 and D2 which are arranged at both sides of the power supply line 24, and diodes D3 and D4 which are arranged at both sides of the ground line 25. Each of the diodes D1 to D4 has the same structure as that of the diode D.

Figure 17:
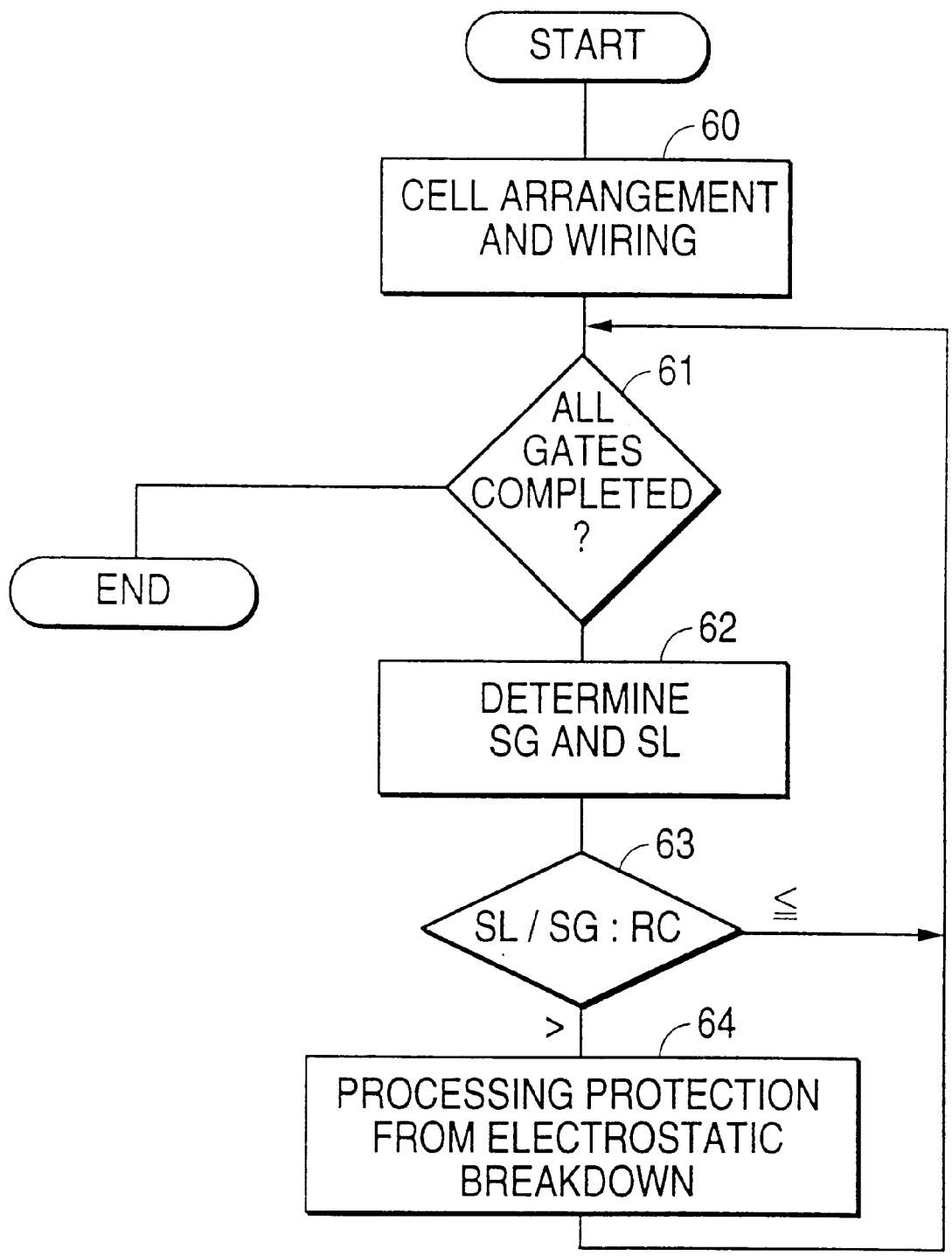
FIG. 17 is a flowchart showing the procedure for layout design of a semiconductor integrated circuit with a protection circuit against electrostatic breakdown.

After the special cells are registered, the processing shown in FIG. 17 is performed. This processing is made automatically by using a computer or interactive processing with a computer. The numbers below in parentheses indicate the identification numbers of the steps shown in FIG. 17.

Figure 18:
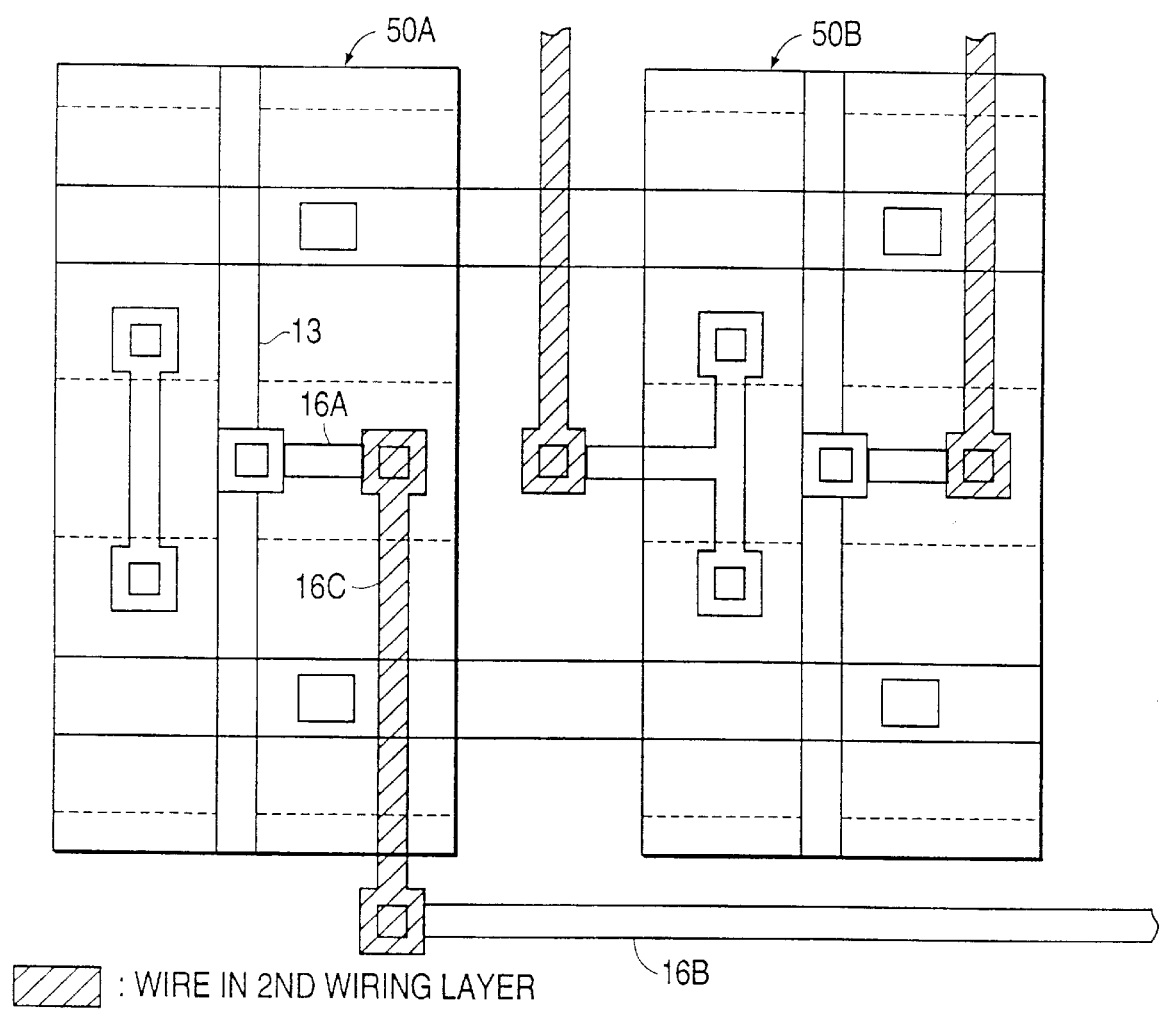
FIG. 18 is a view illustrating a layout pattern obtained by processing in Step 60 shown in FIG. 17.

(60) Arrangement of cells and interconnection between cells are performed by using only the ordinary cells other than the special cells for layout design of the whole semiconductor circuit or macrocells. FIG. 18 shows a part of the results obtained by the processing in this step. In FIG. 18, hatched portions are interconnection metal in the second wiring layer.

(61) The processings in the steps 62 to 64 are made for each of all gates.

(62) The gate area SG and the area SL of the whole wiring connected to the gate are got.

(63) If SL/SG≦RC, where RC is the allowable upper limit of SL/SG, the procedure returns to Step 61, else the procedure goes to step 64.

(64) Processing for protection against electrostatic breakdown is made.

For example, in FIG. 18, it is assumed that when the interconnection metals 16A and 16B in the first metal wiring layer are arranged, the value of SL/SG in regard to the gate polysilicon 13 is not more than RC, but, if the interconnection metal 16A and 16B are connected by the interconnection metal 16C in the second wiring layer, SL/SG>RC results because of long length of the interconnection metal 16B. In this case, any one of the processings A to C below is performed.

Figure 19:
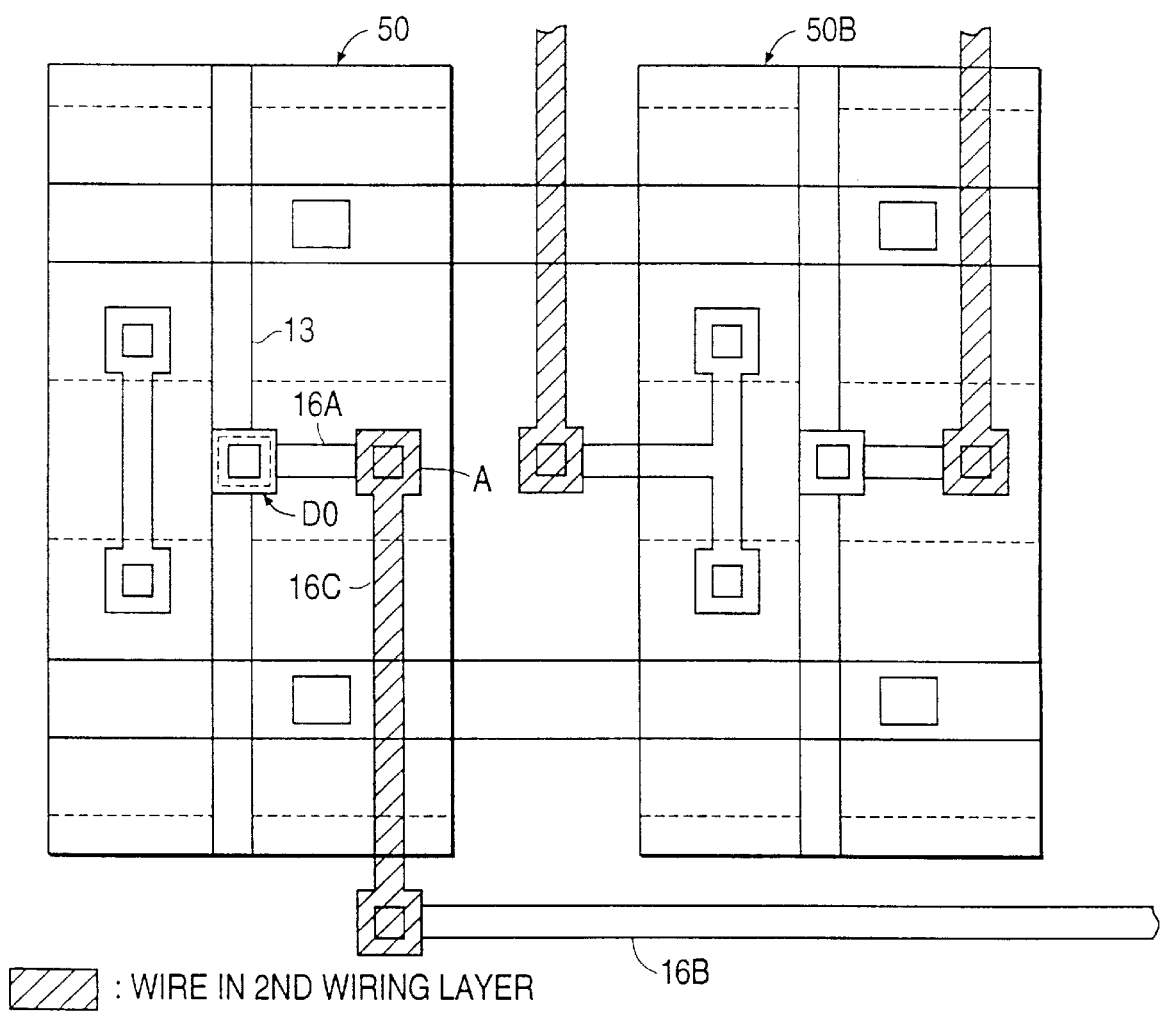
FIG. 19 is a view showing a layout pattern obtained by processing in the first way in Step 64 shown in FIG. 17.

(A) The cell 50A is replaced by the protected cell 50 shown in FIG. 16A, thereby obtaining the pattern shown in FIG. 19. In this method, since it is sufficient to simply replace cell by another one, and there is no need to secure excess region for protection against electrostatic breakdown, the layout design because significantly simple.

Figure 20:
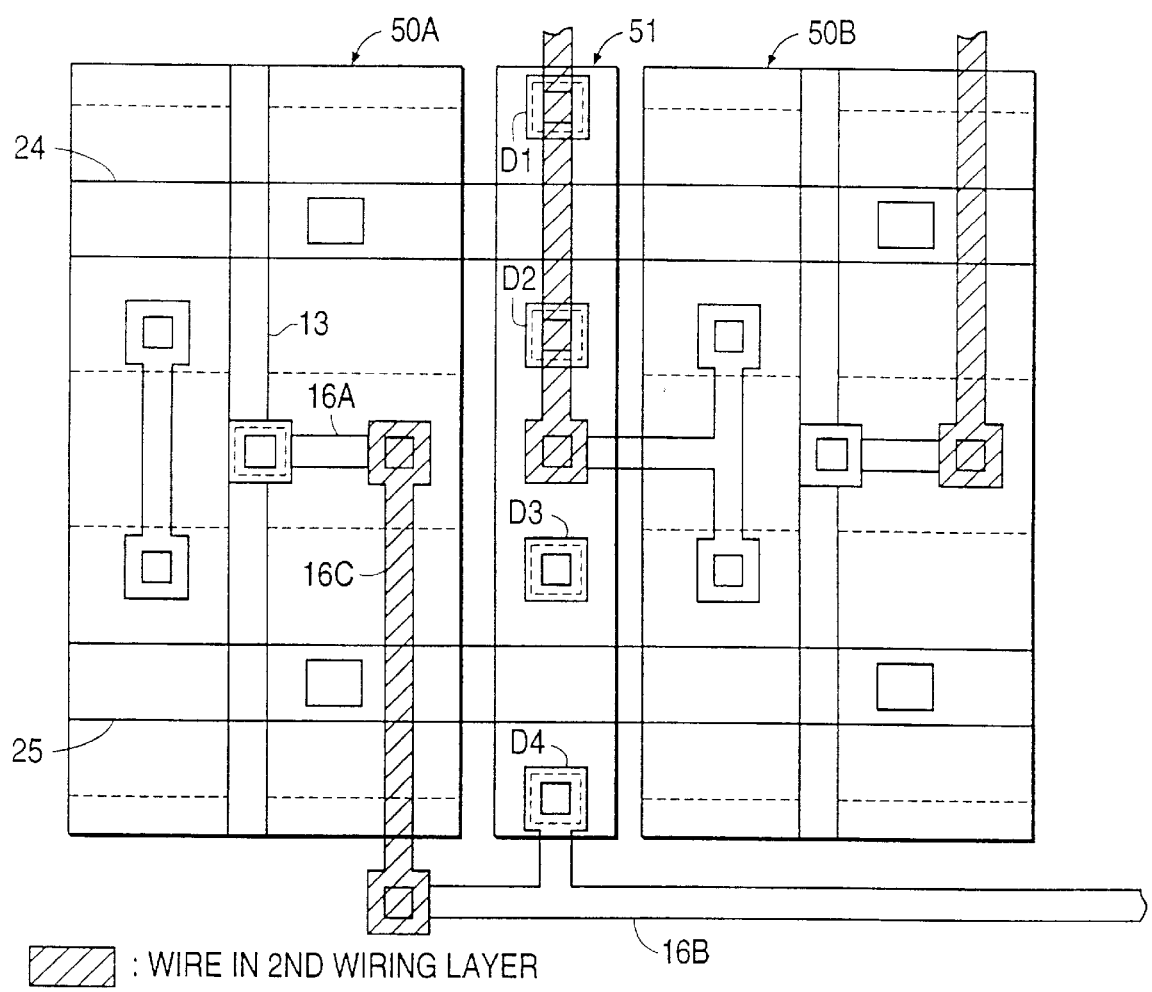
FIG. 20 is a view showing a layout pattern obtained by processing in the second way in Step 64 shown in FIG. 17.

(B) As shown in FIG. 20, the diode cell 51 is arranged between the cells 50A and 50B, and the interconnection metal 16B is branched so as to be connected to the diode D4 of the diode cell 51. In this method, since the diode cell 51 may simply be arranged in the wiring region between the cells as shown in FIG. 20 and there is no need to secure excess region, the layout design becomes simple. In addition, since four diodes can be arranged inside and outside a pair of power supply lines 24 and 25 by using the single diode cell 51 with relatively small width, this method is particularly effective for a case where there is enough space to arrange cells.

Figure 21:
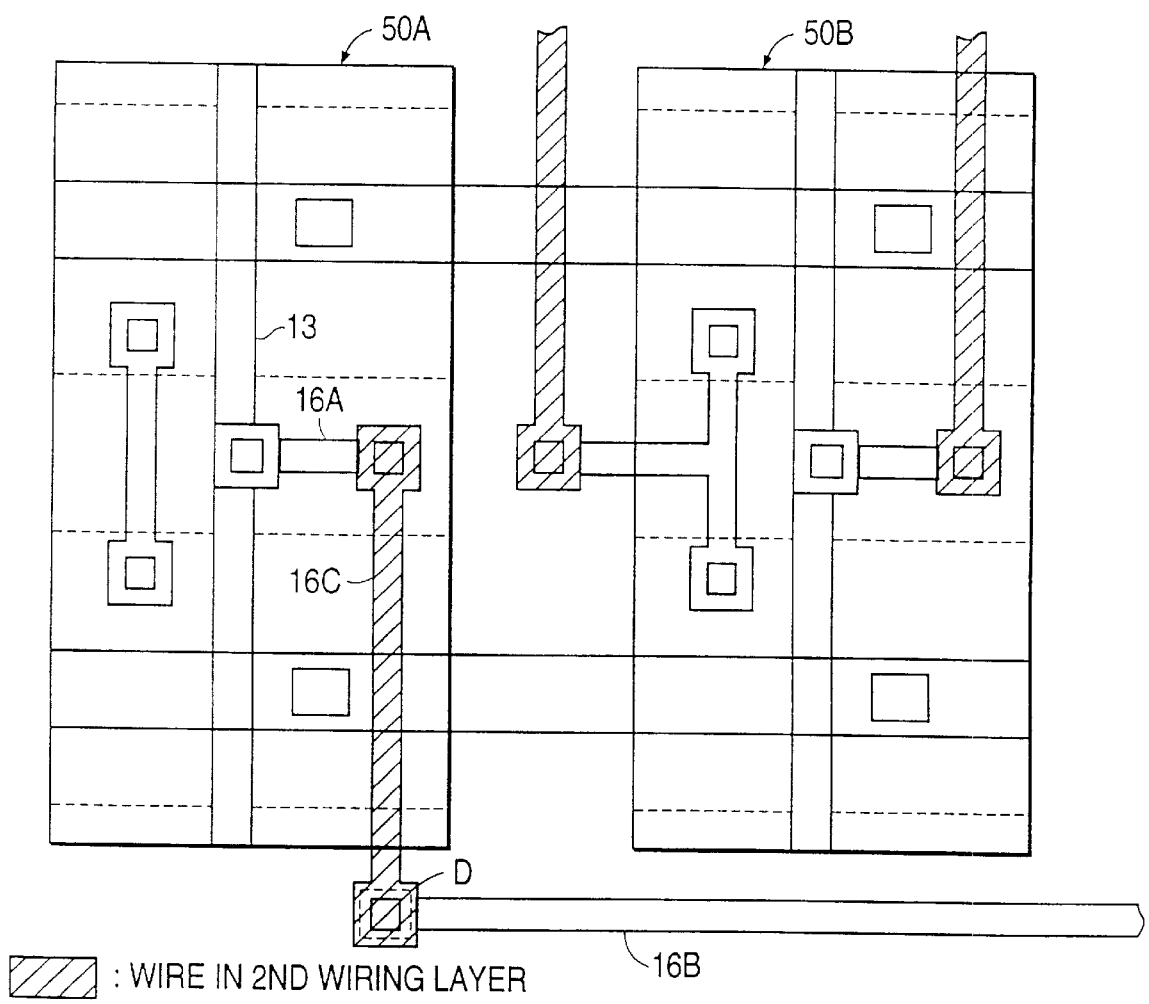
FIG. 21 is a view showing a layout pattern obtained by processing in the third way in Step 64 shown in FIG. 17.

(C) As shown in FIG. 21, the diode D is used at the connection point between the interconnection metals 16B and 16C. Since the pattern of the diode D is relatively small and the diode D can be arranged under signal wiring, this method is particularly effective for a case where there is not sufficient space to arrange the diode cell 51. In addition, since there is no need to secure excess region, the layout design becomes simple.

The procedure then returns to the above Step 61.

The above-described simple processing can prevent the electrostatic breakdown of the gate oxide, which is caused by plasma etching or the like in the production stage.

The special cell 50 may be made by adding the diode D to the ordinary cell 50A in the step 64 without forming the special cell 50 in the preparation stage of the layout design. In addition, in FIG. 19, the position of the diode D0 in the special cell 50 may be an end A of the interconnection metal 16A.

Thirteenth Embodiment

Figure 22:
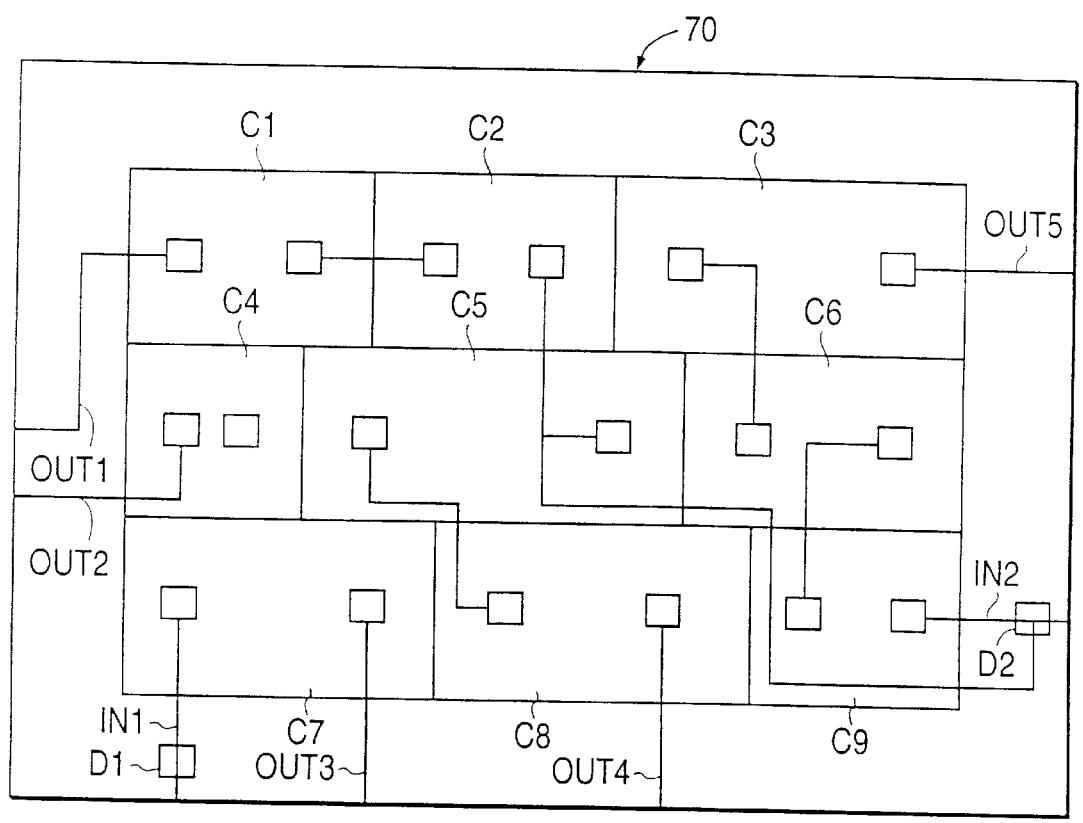
FIG. 22 is a schematic view illustrating the pattern of a macrocell in accordance with a thirteenth embodiment of the present invention.

When macrocells are formed by using the twelfth embodiment, the inspection of the protection against electrostatic breakdown must be made for wiring between the macrocells. Below-described thirteenth embodiment enables the inspection to be omitted by adding the simple structure shown in FIG. 22 to a macrocell.

A macrocell 70 comprises cell C1 to C9, interconnection between the cells, input signal lines IN1 and IN2 in the first metal wiring layer, and output signal lines OUT1 to OUT6 in the first metal wiring layer. The diodes D1 and D2 are connected to all the input signal lines IN1 and IN2, respectively, of the macrocell 70. Since the number of the input signal lines of the macrocell 70 is generally small, even if the diodes are connected to all the input signal lines, the number of the diodes is less increased.

When the input signal line has already been connected to a diode in internal cells, there is no need to connect a diode to the input signal line. In addition, the diodes D1 and D2 may be arranged in the cells C7 and C9, respectively.

Fourteenth Embodiment

The connection between the power supply lines outside the macrocell and the input signal lines in the macrocell, to which the thirteenth embodiment is not applied in order to prevent the operation delay by existence of capacity of diodes, is considered. In the description below, the power supply line means one or the other of a pair of power supply lines which include the ground line.

Since the power supply lines passing through the cells are usually in the first metal wiring layer, and is connected through a contact hole on a diffusion region on the substrate so as to supply reverse bias voltage, electrostatic breakdown is prevented by connecting the input signal lines of the cells to the power supply line without problem. However, when the logical input value is fixed at '0' or '1' by connecting the power supply line outside the cell to the signal input lines of the macrocell, there is a problem of electrostatic breakdown. Since the power supply line is wider than that of the signal wiring and is relatively long, when the input signal lines are connected to the power supply line, electrostatic breakdown easily occurs.

Figure 23A:
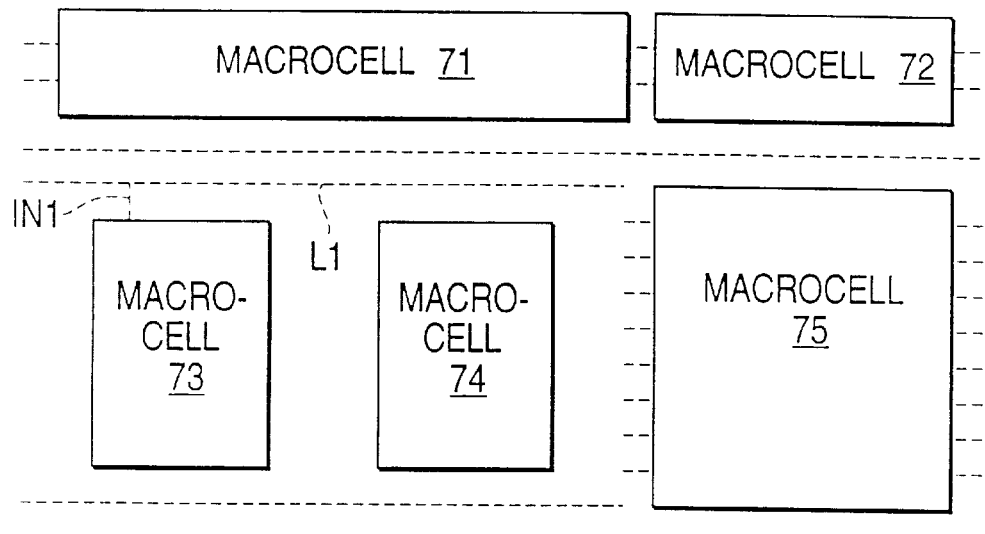
FIGS. 23A and 23B are views showing connection between power supply lines and macrocells in accordance with a fourteenth embodiment of the present invention.
Figure 23B:
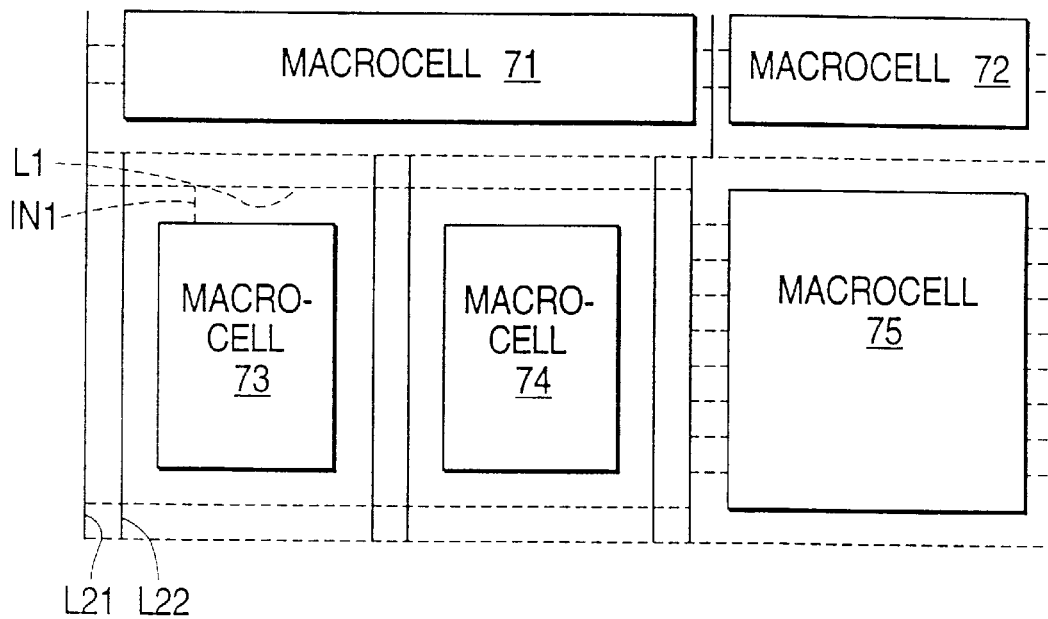

As shown in FIG. 23A, power supply lines denoted by dotted line are provided in the first metal wiring layer outside macrocells 71 to 75 so as to supply power to the macrocells 71 to 75. In FIG. 23A, a short dotted lines drawn from the macrocells are signal lines in the first metal wiring layer. Next, the power supply lines in the second layer are provided, as denoted by solid lines in FIG. 23B.

For example, when the power supply line L1 is connected to the input signal lines IN1 of the macrocell 73, or when the second layer power supply lines L21 and L22 are further connected to the power supply line L1, SL/SG>RC results.

Figure 24:
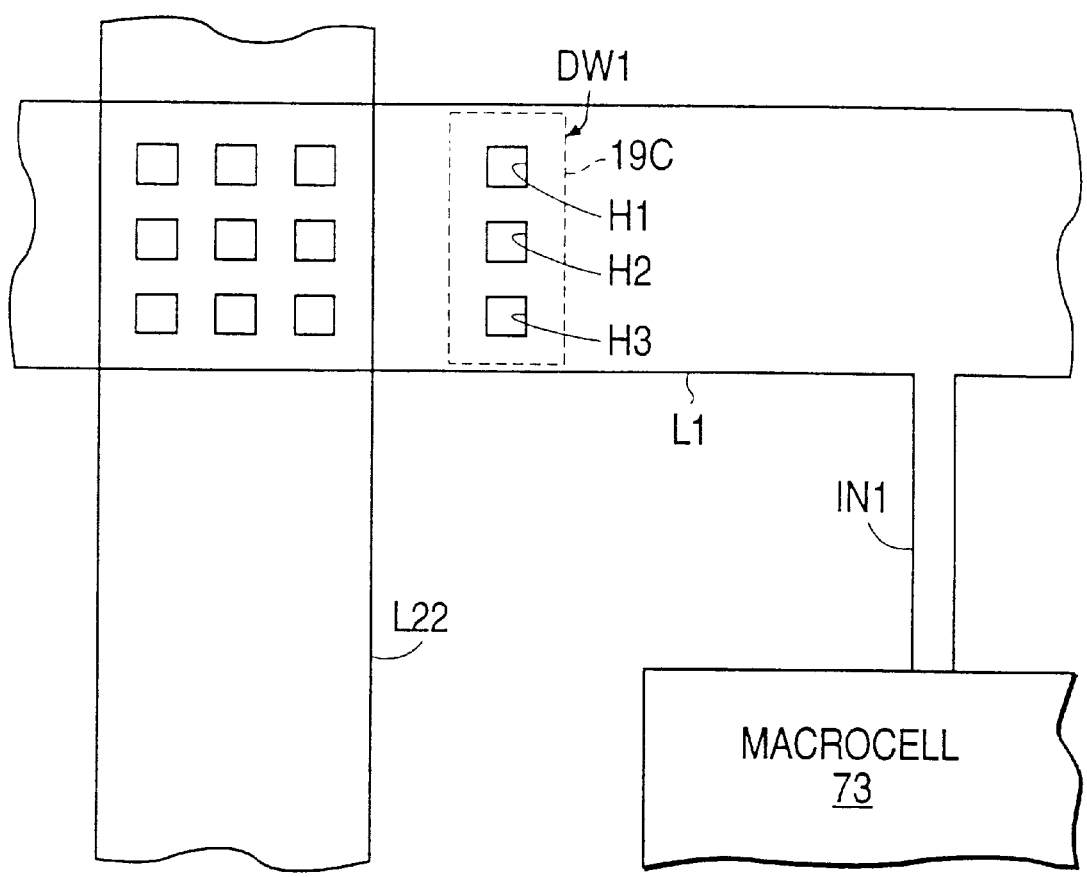
FIG. 24 is a fragmentary view illustrating the pattern of a part of the power supply lines shown in FIG. 23B.

As shown in FIG. 24, the diodes DW1 are thus arranged under the power supply line L1 in the first metal wiring layer. This connect between the power supply line L1 and the $n^+$-type region 19C through the contact holes H1, H2 and H3 which are formed in the oxide, thereby preventing electrostatic breakdown by the pn junction between the $n^+$-type region 19C and the p-type substrate. The diodes are connected to each of all power supply lines for the macrocells.

When the potential of the power supply line L1 is equal to the bias potential to the substrate, like the power supply line shown in FIG. 9, the power supply line L1 may be connected to a diffusion layer containing impurities of the same conduction type as that of impurities contained in the substrate at a higher concentration than that of the substrate in place of the pn junction. This can be applied to the below embodiment.

Fifteenth Embodiment

Figure 25A:
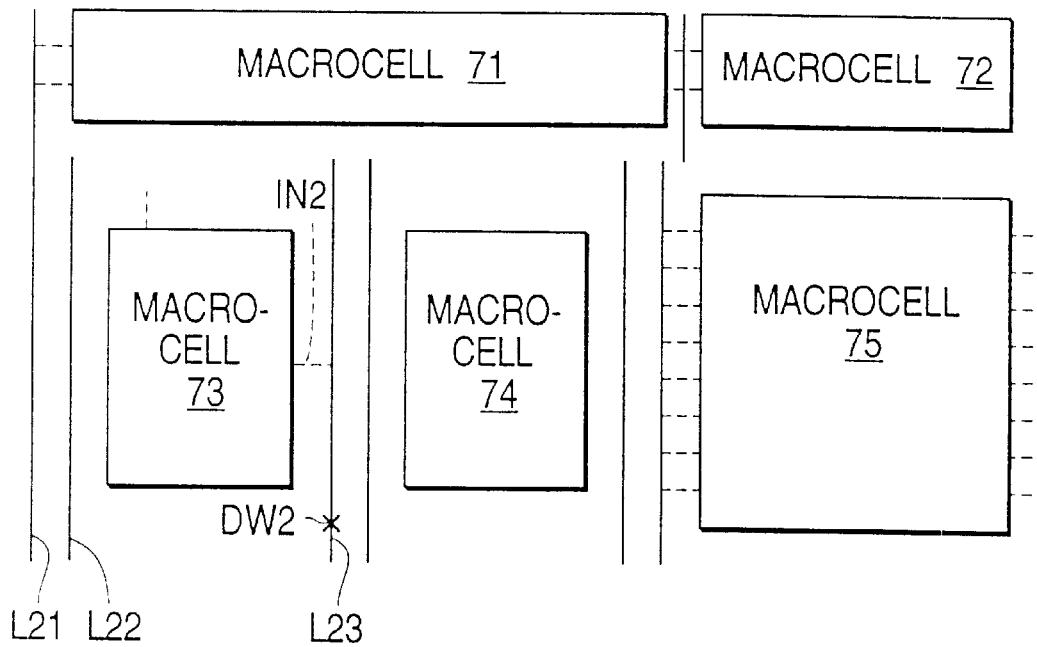
FIGS. 25A and 25B are views showing connection between power supply lines and macrocells in accordance with fifteenth embodiment of the present invention.
Figure 25B:
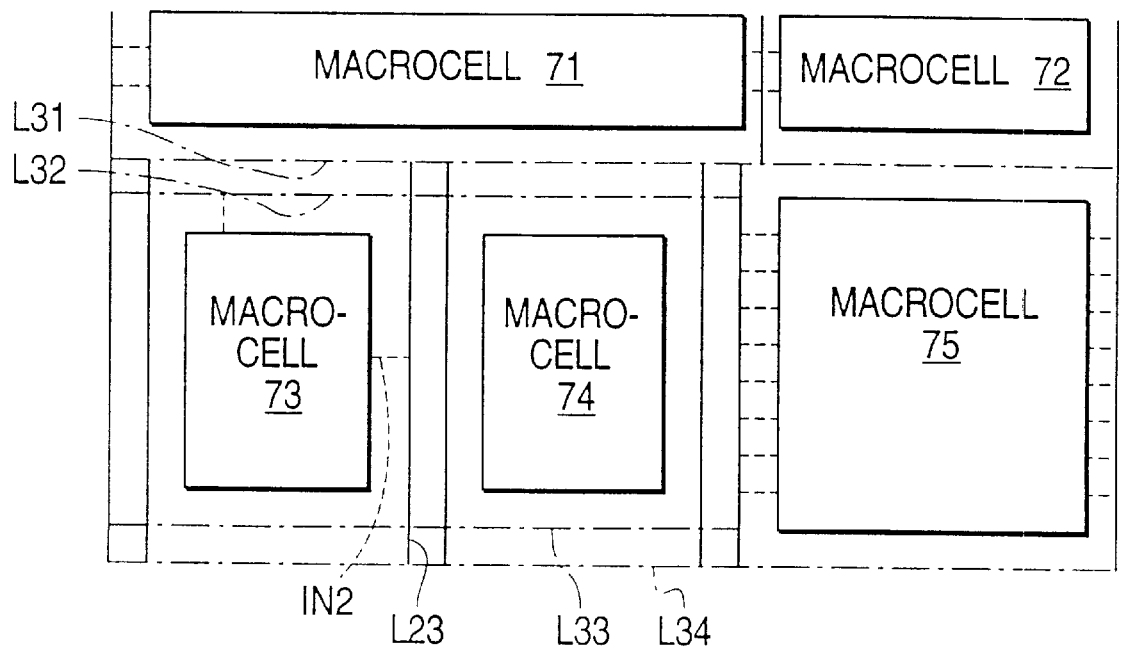

As shown in FIG. 25A, when the input signal line IN2 in the first metal wiring layer of the macrocell 73 is connected to the power supply line L23 in the second wiring layer, the problem of electrostatic breakdown cannot be solved by applying the fourteenth embodiment. The power supply line L23 is then connected to the power supply lines L31 to L34 in the third wiring layer shown by one-dot chain lines in FIG. 25B.

The diodes DW2 are thus arranged under the power supply line L23 and connected to the power supply line L23.

Figure 26A:
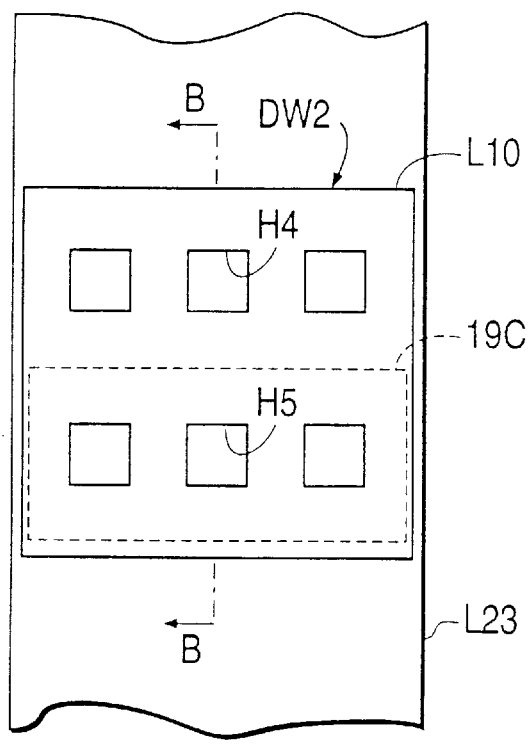
FIG. 26A is a view illustrating the pattern of a part of the power supply line shown in FIG. 25B.
Figure 26B:
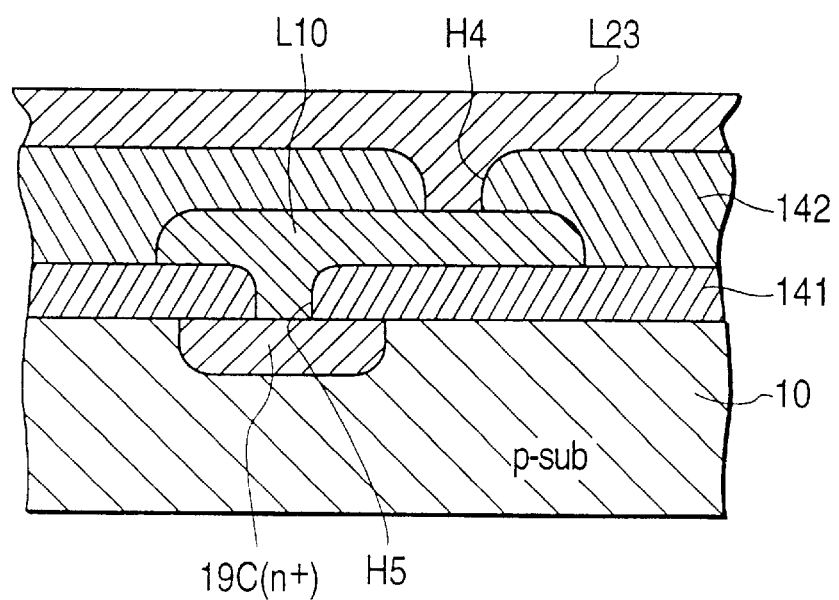
FIG. 26B is a sectional view taken along line B—B in FIG. 26A.
Figure 27:
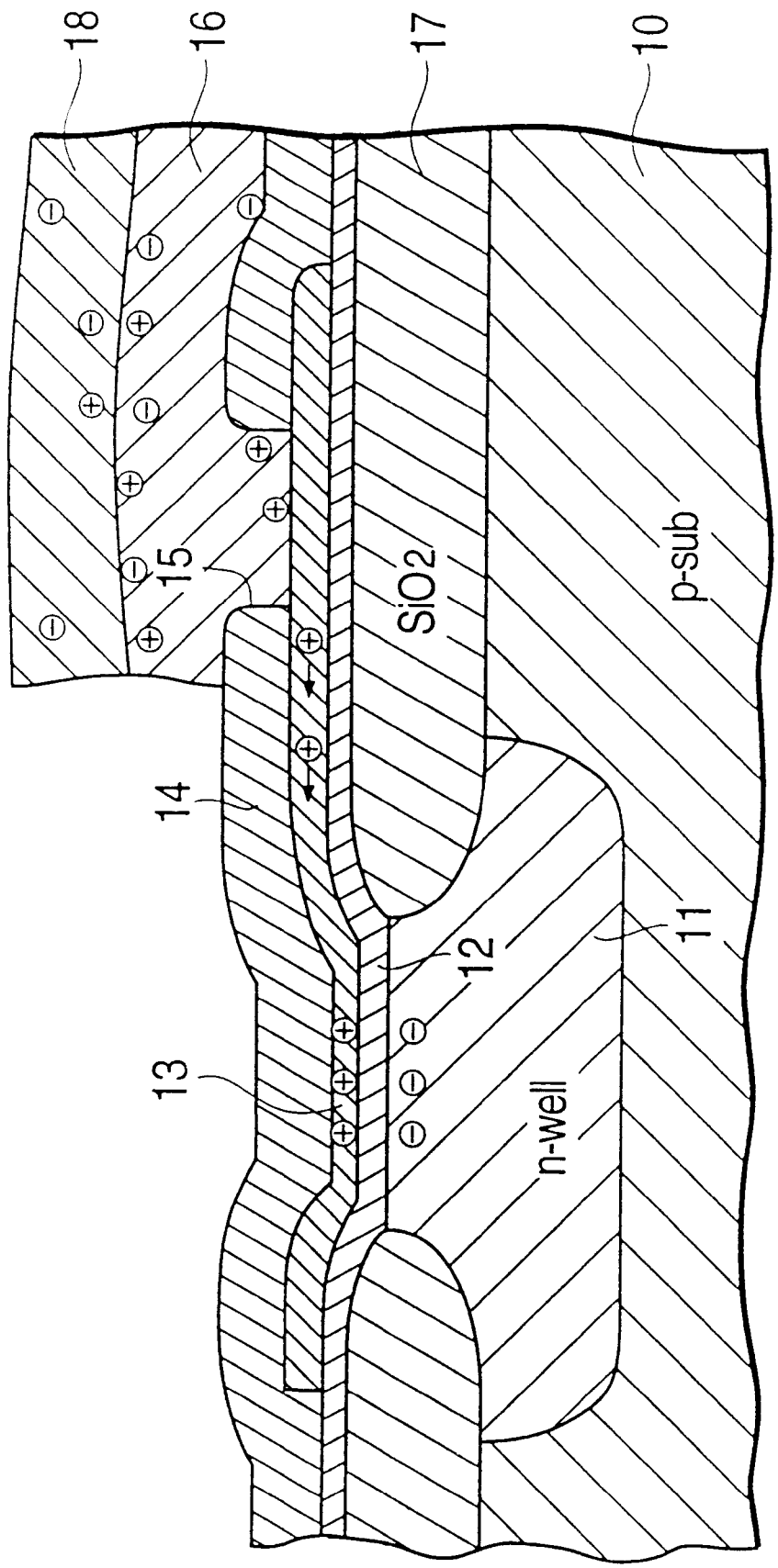
FIG. 27 is a sectional view illustrating a cause of electrostatic breakdown of a gate oxide in a process of fabricating a IC.
Figure 28A:
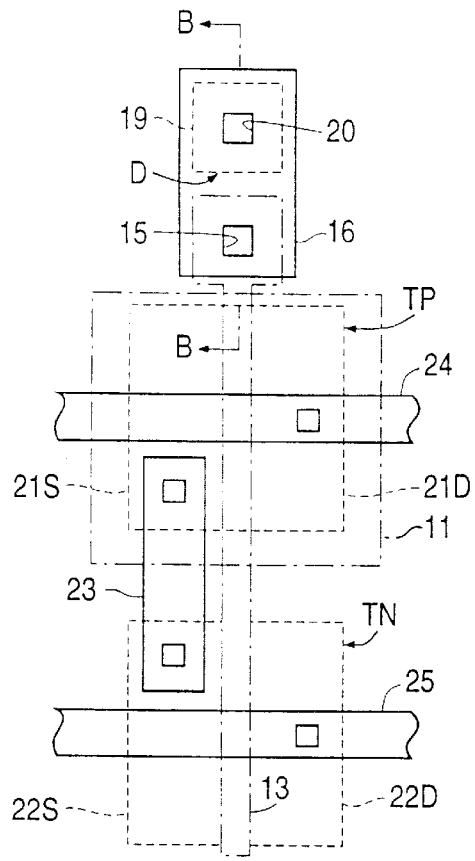
FIG. 28A is a view illustrating the pattern of a CMOS inverter provided with a conventional protection circuit against electrostatic breakdown.
Figure 28B:
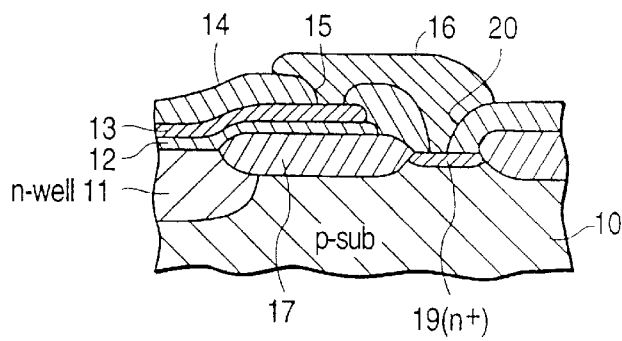
FIG. 28B is a sectional view taken along line B—B in FIG. 28A.

As shown in FIGS. 26A and 26B, the diode DW2 comprises the $n^+$-type region 19C formed on the p-type substrate 10, the insulator 141 deposited on the p-type substrate 10 and the land L10 connected to the $n^+$-type region 19C through the contact hole H5 formed in the insulator 141 above the central portion of the $n^+$-type region 19C. The power supply line L23 is connected to the land L10 through the contact hole H4 formed in the insulator 142. The diode DW2 is connected to all of the power supply lines in the second wiring layer for the macrocells.

While there has been described what is at present considered to be preferred embodiment of the invention, it will be understood that various modifications may be made therein, and it is intended to cover in the appended claims all such modifications as fall within the true spirit and scope of the invention. For example, the present invention can be applied to the other MIS transistors than MOS transistor. Also, the steps of 62 and 63 in FIG. 17 may be omitted because there are apparent casses that which gate should be connected to the pn junction.

What is claimed is:

1. A semiconductor integrated circuit with protecting against electrostatic breakdown, wherein MIS transistors are provided on a substrate, and power supply lines are arranged near the MIS transistors, comprising;

a pn junction formed between a first conduction type region formed on the substrate and a second conduction type, which is opposite type to said first conduction type, formed around said first conduction type region in the substrate, said pn junction being located under said power supply line and by the MIS transistor;

wherein a gate line of said MIS transistor is extended to a region between said power supply line and said pn junction, one end of said gate being connected to the surface of said first conduction type region through a contact hole.

2. A semiconductor integrated circuit according to claim 1;

wherein said opposite conduction type region is formed on said substrate so as to be biased by connecting to said power supply line, and contains impurities at a concentration higher than that of the periphery thereof.

3. A semiconductor integrated circuit according to claim 1;

wherein a part of said extended portion of said gate line has a higher resistivity than that of the other part of said gate line.

4. A semiconductor integrated circuit according to claim 2;

wherein a part of said extended portion of said gate line has a higher resistivity than that of the other part of said gate line.

5. A semiconductor integrated circuit according to claim 3;

wherein said part of said extended portion of said gate is narrower than said other part of said gate line so as to have high resistivity.

6. A semiconductor integrated circuit according to claim 3;

wherein said part of said extended portion of said gate is narrower than said other part of said gate line so as to have high resistivity.

7. A semiconductor integrated circuit according to claim 3;

wherein said part of said extended portion of said gate is curved in the direction perpendicular to said substrate, and the curved portion is thinner than that of the other portion of said gate so as to have high resistivity.

8. A semiconductor integrated circuit according to claim 4;

wherein said part of said extended portion of said gate is curved in the direction perpendicular to said substrate, and the curved portion is thinner than that of the other portion of said gate so as to have high resistivity.

* * * * *